United States Patent
Rozen

(10) Patent No.: US 12,369,330 B2
(45) Date of Patent: Jul. 22, 2025

(54) SELF-ALIGNED CROSSBAR-COMPATIBLE ELECTROCHEMICAL MEMORY STRUCTURE

(71) Applicant: INTERNATIONAL BUSINESS MACHINES CORPORATION, Armonk, NY (US)

(72) Inventor: John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 675 days.

(21) Appl. No.: 17/455,737

(22) Filed: Nov. 19, 2021

(65) Prior Publication Data
US 2023/0165015 A1 May 25, 2023

(51) Int. Cl.
H10B 61/00 (2023.01)
H10N 50/01 (2023.01)
H10N 50/80 (2023.01)

(52) U.S. Cl.
CPC ............ *H10B 61/20* (2023.02); *H10N 50/01* (2023.02); *H10N 50/80* (2023.02)

(58) Field of Classification Search
None
See application file for complete search history.

(56) References Cited

U.S. PATENT DOCUMENTS

| | | | |
|---|---|---|---|
| 7,989,902 B2 | 8/2011 | Ando | |
| 9,224,946 B2 | 12/2015 | Kim | |
| 9,887,351 B1 | 2/2018 | Ando | |
| 10,079,341 B1 | 9/2018 | Bedell | |
| 10,090,461 B2 | 10/2018 | Karpov | |
| 10,186,657 B2 | 1/2019 | Brew | |
| 10,810,506 B1 | 10/2020 | Zota | |
| 10,885,979 B2 | 1/2021 | Tang | |
| 10,902,912 B2 | 1/2021 | Tang | |
| 10,915,811 B1 | 2/2021 | Ando | |
| 2012/0037879 A1* | 2/2012 | Schloss | H10B 63/82 257/5 |
| 2013/0193396 A1 | 8/2013 | Nakano | |
| 2014/0306172 A1 | 10/2014 | Sills | |
| 2016/0204279 A1 | 7/2016 | Horch | |
| 2017/0365641 A1 | 12/2017 | Bedau | |

(Continued)

FOREIGN PATENT DOCUMENTS

CN 113540150 A 10/2021
WO 2023/087773 A1 5/2023

OTHER PUBLICATIONS

Chen et al., "Impact of tungsten oxidation conditions on the performance of Al2O3/WOx-based CBRAM devices", Microelectronic Engineering 179 (2017), Available online Apr. 26, 2017, pp. 56-59.

(Continued)

*Primary Examiner* — Khaja Ahmad
(74) *Attorney, Agent, or Firm* — L. Jeffrey Kelly

(57) ABSTRACT

A memory structure is provided. The memory structure includes a top terminal, a multi-level nonvolatile electrochemical cell, a bottom terminal, a pedestal contact in the same metal level as the bottom terminal, and a vertical conductor fully self-aligned to the multi-level nonvolatile electrochemical cell and extending vertically from the pedestal contact.

20 Claims, 17 Drawing Sheets

(56) References Cited

U.S. PATENT DOCUMENTS

| | | | |
|---|---|---|---|
| 2018/0197917 A1 | 7/2018 | Ando | |
| 2018/0219155 A1 | 8/2018 | Ando | |
| 2018/0261764 A1* | 9/2018 | Bedell | H10N 70/253 |
| 2018/0293487 A1* | 10/2018 | Copel | G06N 3/049 |
| 2020/0327941 A1 | 10/2020 | Tang | |
| 2020/0373354 A1 | 11/2020 | Tang | |
| 2021/0125043 A1 | 4/2021 | Bragaglia | |
| 2021/0150327 A1 | 5/2021 | Bohnstingl | |
| 2021/0257409 A1 | 8/2021 | Hyun | |

OTHER PUBLICATIONS

Fuller et al., "Li-Ion Synaptic Transistor for Low Power Analog Computing", Adv. Mater. 2017, 29, 1604310, 8 pages.

Fuller et al., "Parallel programming of an iconic floating-gate memory array for scalable neuromorphic computing", Science, Reports, First release: Apr. 25, 2019, 9 pages.

Gokmen et al., "Acceleration of Deep Neural Network Training with Resistive Cross-Point Devices: Design Considerations", frontiers in Neuroscience, Original Research, Published Jul. 21, 2016, vol. 10, Article 333, pp. 1-13.

Kim et al., "Metal-oxide based, CMOS-compatible ECRAM for Deep Learning Accelerator", IEDM19-847, © 2019 IEEE, pp. 35.7.1-35.7.4.

Pending U.S. Appl. No. 16/513,871, filed Jul. 17, 2019, entitled: "Metal-Oxide-Based Neuromorphic Device", 51 pages.

Pending U.S. Appl. No. 17/217,767, filed Mar. 30, 2021, entitled: "Two-Terminal Non-Volatile Memory Cell for Decoupled Read and Write Operations", 29 pages.

Tang et al., "ECRAM as Scalable Synaptic Cell for High-Speed, Low-Power Neuromorphic Computing", IEDM18-292, © 2018 IEEE, pp. 13.1.1-13.1.4.

Van De Burgt et al., "A non-volatile organic electrochemical device as a low-voltage artificial synapse for neuromorphic computing", nature materials, Letters, Published Online: Feb. 20, 2017 | DOI: 10.1038/NMAT4856, pp. 1-6.

Notification of Transmittal of the International Search Report and the Written Opinion of the International Searching Authority, or the Declaration, Date of Mailing Oct. 11, 2022, Applicant's or agent's file reference IEE220627PCT, International application No. PCT/CN2022/108481, 9 pages.

Chen et al. "A CMOS-compatible electronic synapse device based on Cu/SiO2/W programmable metallization cells", Nanotechnology, Jun. 24, 2016, 10 pages, vol. 27, No. 25.

* cited by examiner

SELF-ALIGNED CROSSBAR-COMPATIBLE ELECTROCHEMICAL MEMORY STRUCTURE

BACKGROUND

The present invention relates to resistive analog memory structures, and more specifically, to a self-aligned crossbar-compatible electrochemical memory structure.

Technical problems such as character recognition and image recognition by a computer are known to be well handled by machine-learning techniques. "Machine learning" is used to broadly describe a primary function of electronic systems that learn from data. In machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANNs can include deep neural networks (DNNs), convolutional neural networks (CNNs), and other types of neural networks. Crossbar arrays are high density, low cost circuit architectures used to form a variety of electronic circuits and devices, including ANN architectures, neuromorphic microchips and ultra-high density nonvolatile memory. A basic cross-bar array configuration includes a set of conductive row wires and a set of conductive column wires formed to intersect the set of conductive row wires. The intersections between the two sets of wires are separated by so-called cross-point devices. Such cross-point devices may be analog memory devices capable of storing a weighted value (e.g., 0-1 instead of the binary 0 or 1), and may be capable of use in analog computing devices.

Cross-point devices can be implemented as so-called resistive memory (colloquially, memristive) devices. Characteristics of a memristive device may include non-volatility, the ability to store a variable analog resistance value, the ability to determine the analog resistance value without disturbing the state of the memristive device, and the ability to tune up or tune down a resistance using current or voltage pulses. These memristive devices can be used in hardware to simulate the artificial synapses of an ANN.

BRIEF SUMMARY

According another exemplary embodiment, memory structure is provided. The memory structure includes a top terminal, a multi-level nonvolatile electrochemical cell, a bottom terminal, a pedestal contact in the same metal level as the bottom terminal, and a vertical conductor fully self-aligned to the multi-level nonvolatile electrochemical cell and extending vertically from the pedestal contact.

According another exemplary embodiment, a memory structure is provided. The memory structure includes a top terminal contacting a top contact, a multi-level nonvolatile electrochemical cell, a bottom terminal contacting a variable resistance channel of the multi-level nonvolatile electrochemical cell, a pedestal contact in the same metal level as the bottom terminal and contacting the variable resistance channel of the multi-level nonvolatile electrochemical cell, and a vertical conductor fully self-aligned to the multi-level nonvolatile electrochemical cell and extending vertically between the pedestal contact and the top contact.

An embodiment of the memory structure may include a dielectric sidewall spacer separating the multi-level nonvolatile electrochemical cell from the self-aligned vertical conductor.

An embodiment of the memory structure may include a single via as the top terminal.

An embodiment of the memory structure may include a height of the self-aligned vertical conductor is equal to a height of the multi-level nonvolatile electrochemical cell.

An embodiment of the memory structure may include the self-aligned vertical conductor directly contacting sidewalls of the multi-level nonvolatile electrochemical cell.

An embodiment of the memory structure may include the pedestal contact including multiple individual contact structures.

An embodiment of the memory structure may include wherein the pedestal contact being a single congruent structure.

An embodiment of the memory structure may include the pedestal contact surrounding the bottom terminal.

According another exemplary embodiment, a method of forming a memory structure is provided. The method includes forming a top terminal contacting a top contact, forming a multi-level nonvolatile electrochemical cell, forming a bottom terminal contacting a variable resistance channel of the multi-level nonvolatile electrochemical cell, forming a pedestal contact in the same metal level as the bottom terminal and contacting the variable resistance channel of the multi-level nonvolatile electrochemical cell, and forming a vertical conducting fully self-aligned to the multi-level nonvolatile electrochemical cell and extending vertically between the pedestal contact and the top contact.

An embodiment of the method of forming a memory structure may include forming a dielectric sidewall spacer separating the multi-level nonvolatile electrochemical cell from the self-aligned vertical conductor.

An embodiment of the method of forming a memory structure may include the pedestal contact comprising multiple individual contact structures.

An embodiment of the method of forming a memory structure may include the pedestal contact being a single congruent structure.

BRIEF DESCRIPTION OF THE DRAWINGS

The following detailed description, given by way of example and not intended to limit the invention solely thereto, will best be appreciated in conjunction with the accompanying drawings, in which:

FIG. 1 depicts a top-down view of the memory structure after forming a bottom terminal and a conductive pedestal located in an insulating layer, according to an exemplary embodiment;

FIG. 2 depicts a cross-sectional view of the memory structure after forming the bottom terminal and the conductive pedestal located in the insulating layer, according to an exemplary embodiment;

FIG. 3 depicts a cross-sectional view of the memory structure after forming a channel material layer, an ion exchange material layer, a reservoir material layer, and a contact material layer, according to an exemplary embodiment;

FIG. 4 depicts a cross-sectional view of the memory structure after forming a memory cell, according to an exemplary embodiment;

FIG. 5 depicts a cross-sectional view of the memory structure after forming a metal contact layer, according to an exemplary embodiment;

FIG. 6 depicts a cross-sectional view of the memory structure after forming vertical conductors and an $M_{x+1}$ dielectric, according to an exemplary embodiment;

FIG. 7 depicts a cross-sectional view of the memory structure after forming an $M_{x+2}$ dielectric and a top terminal, according to an exemplary embodiment;

FIG. 12 depicts a cross-sectional view of the memory structure according to an alternative embodiment;

FIG. 13 depicts a cross-sectional view of the memory structure according to an alternative embodiment;

FIG. 14 depicts a cross-sectional view of the memory structure according to an alternative embodiment;

FIG. 15 depicts a cross-sectional view of the memory structure according to an alternative embodiment;

FIG. 16 depicts a cross-sectional view of the memory structure after forming a dielectric layer, according to an alternative exemplary embodiment;

FIG. 17 depicts a cross-sectional view of the memory structure after recessing the dielectric layer to form dielectric spacers and forming the $M_{x+1}$ dielectric, according to an alternative exemplary embodiment;

FIG. 18 depicts a cross-sectional view of the memory structure after forming the metal contact layer, according to an alternative exemplary embodiment;

FIG. 19 depicts a cross-sectional view of the memory structure after recessing the metal contact layer to form the vertical conductors and forming the $M_{x+1}$ dielectric, according to an alternative exemplary embodiment;

FIG. 20 depicts a cross-sectional view of the memory structure after forming the $M_{x+2}$ dielectric and the top terminal, according to an alternative exemplary embodiment;

FIG. 21 depicts a cross-sectional view of the memory structure according to an alternative embodiment;

FIG. 22 depicts a cross-sectional view of the memory structure according to an alternative embodiment;

FIG. 23 depicts a cross-sectional view of the memory structure according to an alternative embodiment;

FIG. 24 depicts a cross-sectional view of the memory structure according to an alternative embodiment;

FIG. 25 depicts a cross-sectional view of the memory structure according to an alternative embodiment; and FIG. 26 depicts a cross-sectional view of the memory structure according to an alternative embodiment.

Figure 1:
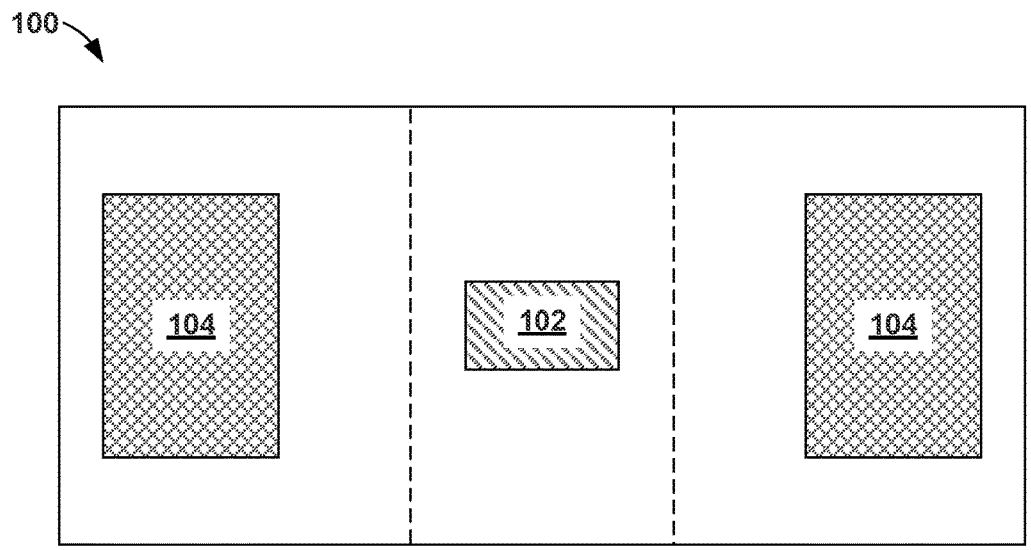
FIGS. 1-7 depict various views of a semiconductor structure during an intermediate step of a method of fabricating a memory structure with two terminals, a programmable resistance channel, and an insulating charge-exchange gate stack, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Analog resistive memory devices may use mechanisms of ion transfer during write operations to impact the resistance of the overall memory device during read operations. Such devices may enable migration of conductive ions into a dielectric region, thereby increasing the conductivity through the dielectric, or alternatively may enable migration of ions containing holes into a conductive region, thereby reducing the conductivity of the conductive region. However, read and write paths of these devices overlap, leading to breakdown of the dielectric, read disturb, and overall operational stochasticity of the device. By decoupling the read path and write path during operations, such issues may be reduced, as the flow of current through the devices is not required to move through a dielectric layer of the device.

However, decoupling of read and write paths would typically require additional wiring to the device, as well as additional transistors to signal the device, thereby increasing the footprint of structures needed to operate the device. By providing separate contacts to the memory cell for read and write paths, while maintaining a common terminal for the read and write contacts, the footprint of the structures may be reduced, while maintaining decoupled read and write paths for the resistive analog memory device.

Here, embodiments of the present invention reduce integration complexity while further maintaining a two terminal cell footprint. Embodiments of the present invention further reduce integration complexity and enable insertion of two-terminal electrochemical memory structure in true-crossbar architectures without requiring additional vias.

The present invention relates to resistive analog memory devices, and more specifically, to a self-aligned crossbar-compatible electrochemical memory structure. More specifically, the self-aligned crossbar-compatible electrochemical memory structure disclosed herein includes two terminals, a programmable resistance channel, and an insulating charge-exchange gate stack. Embodiments of the present invention propose reducing the footprint of the two-terminal memory structure by forming a self-aligned vertical conductors. Doing so reduces integration complexity and enables insertion of two-terminal electrochemical memory structure in true-crossbar architectures without requiring additional vias. Exemplary embodiments of the self-aligned crossbar-compatible electrochemical memory structure are described in detail below by referring to the accompanying drawings in FIGS. 1 to 26. Those skilled in the art will readily appreciate that the detailed description given herein with respect to these figures is for explanatory purposes as the invention extends beyond these limited embodiments.

Figure 2:
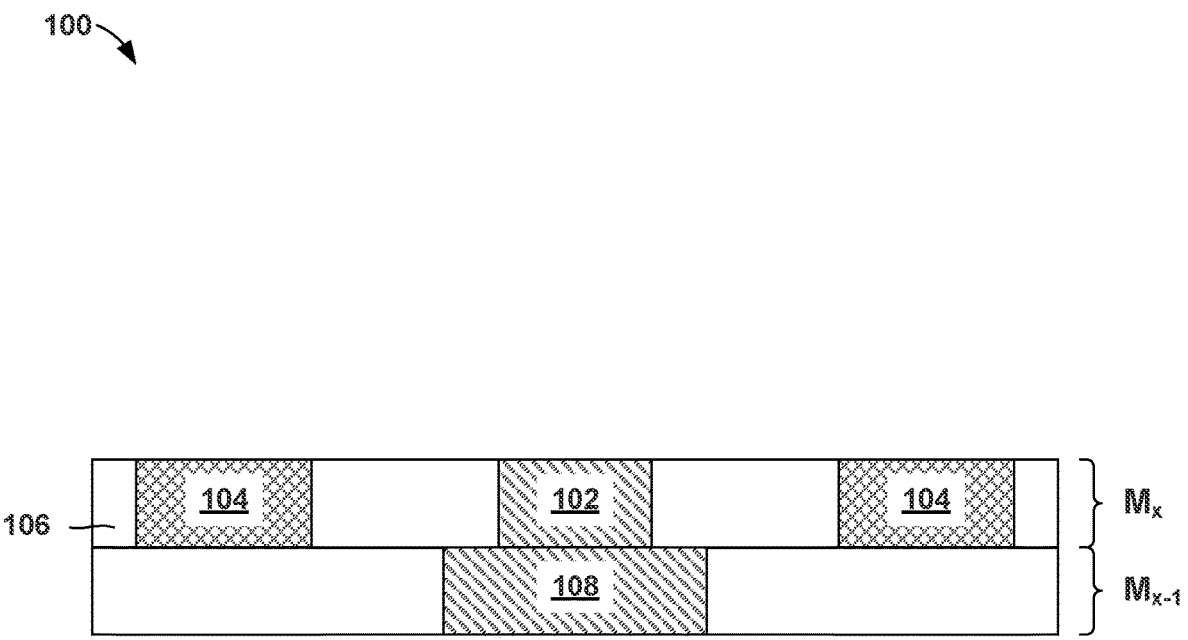

Referring now to FIGS. 1 and 2, a memory structure 100 is shown during an intermediate step of a method of fabricating a self-aligned crossbar-compatible electrochemical memory cell in accordance with an embodiment of the present invention. FIG. 1 illustrates a top-down view of a bottom terminal 102 and a pedestal contact 104 located in an $M_x$ dielectric 106. FIG. 2 illustrates a cross-sectional view of the bottom terminal 102 and the pedestal contact 104 located in the $M_x$ dielectric 106. The $M_x$ dielectric 106 may be formed on a sub structure, such as, for example, an $M_{x-1}$ layer. The $M_{x-1}$ layer includes a bottom metal line 108, which may serve as a bit line of a cross-point memory array, as described below with reference to FIG. 9. The bottom metal line 108 may be formed by any suitable techniques using conventional materials.

The $M_x$ dielectric 106 may be silicon nitride, silicon oxide, silicon oxynitride, or any other suitable low-k dielectrics. After being deposited, the $M_x$ dielectric 106 can be patterned and etched by any appropriate lithographic process to form regions, or trenches, in which the bottom terminal 102 and the pedestal contact 104 are formed.

The bottom terminal 102 and the pedestal contact 104 can be formed from metal, metal nitride, or some combination thereof. In one or more embodiments of the present invention the bottom terminal 102 and the pedestal contact 104 are made using tungsten at a thickness of about 50 nm; however, it should be understood that any appropriate material and thickness can be used, including for example tungsten, nickel, molybdenum, tantalum, copper, silver, gold, ruthenium, iridium, rhenium, rhodium, and alloys thereof. In one or more embodiments of the present invention the bottom terminal 102 and the pedestal contact 104 can be formed by an appropriate physical vapor deposition technique, whereby a sputtering apparatus can include electron-beam evaporation, thermal evaporation, direct-current diode systems, radio frequency sputtering, magnetron sputtering, or ionized metal plasma sputtering. Following deposition of the material for the bottom terminal 102 and the pedestal contact 104, a chemical mechanical polishing technique is used to remove excess material above the $M_x$ dielectric 106, forming a substantially planar surface across the $M_x$ dielectric 106, the bottom terminal 102, and the pedestal contact 104.

In an alternative embodiment, the bottom terminal 102 and the pedestal contact 104 may be formed in separate steps, for example, one before the other. Doing so, would allow each of the bottom terminal 102 and the pedestal contact 104 to be fabricated with different materials, different dimensions or both. As described below with respect to FIGS. 14, it may be advantageous for the bottom terminal 102 to be taller or thicker than the pedestal contact 104 to provide electrical isolation between the pedestal contact 104 and the bottom metal line 108, necessary with certain configurations of the pedestal contact 104.

Figure 3:
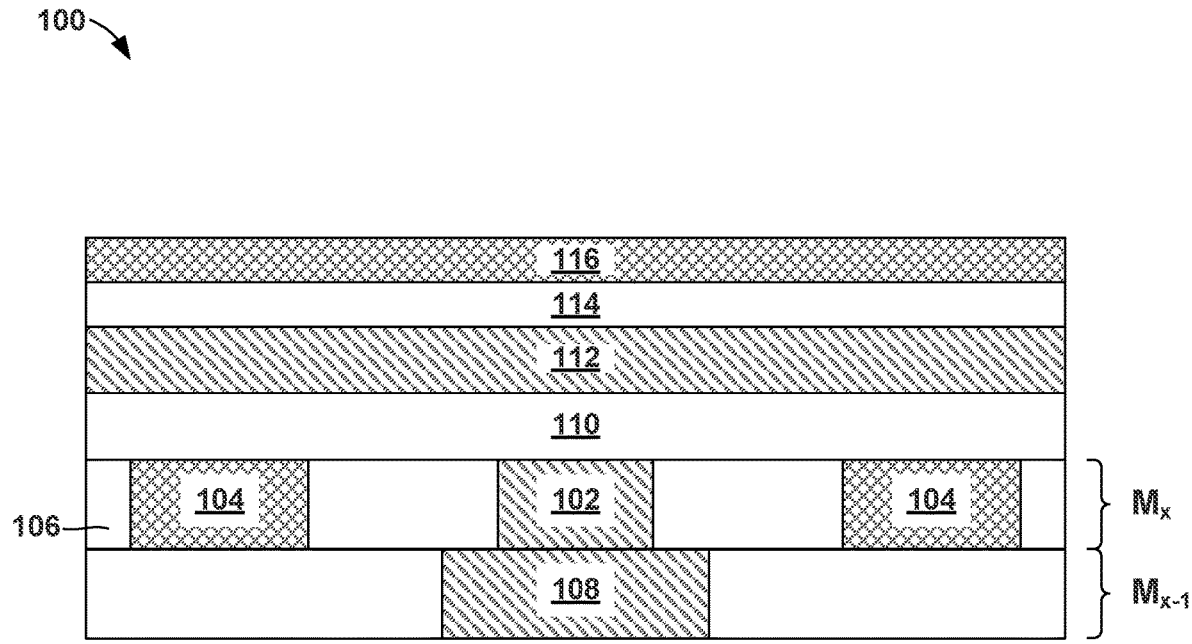

Referring now to FIG. 3, the memory structure 100 is shown after formation of a channel material layer 110, an ion exchange material layer 112, a reservoir material layer 114, and a contact material layer 116 in accordance with an embodiment of the present invention. In one or more embodiments of the present invention the channel material layer 110 is formed from a variable-resistance material that changes resistance based on its oxygen or hydrogen content and is composed of metal-oxides such as WOx, TiOx, VOx, TaOx, HfOx. For example, the variable-resistance material can be WO3, TiO2, HfO2, Ta2O5, VxOy, and their suboxides. The channel material layer 110 can be formed by any appropriate deposition process such as, for example, PVD, ALD, and CVD. For example, a metal-oxide layer about 50 nm thick can be formed by sputtering, or a layer of about 40 nm thick can be formed by electron beam evaporation. The channel material layer 110 can be made 1-50 nm in thickness in some examples.

The ion exchange material layer 112 may be formed on the channel material layer 110. The ion exchange material layer 112 may be formed using a dielectric material composed of a metal-oxide such as HfOx or TaOx in their sub-oxide or stoichiometric form, for example, $HfO_2$, $Ta_2O_5$, and their sub-oxides. The ion exchange material layer 112 can be of a thickness ranging from about 1 nm to about 50 nm. The ion exchange material layer 112 must have a resistance/$cm^2$ 10× to orders of magnitudes higher than the resistance/$cm^2$ of the channel material layer 110. The ion exchange material layer 112 can be formed using chemical vapor deposition (CVD), physical vapor deposition (PVD), or atomic layer deposition (ALD).

It should be noted that described herein are some possible carriers and effects yielding reversible tunability of the device, however, in other examples different techniques may be used. The charge exchange can include non-metallic ions (oxygen, hydrogen) modifying the resistivity of the channel material layer 110. The charge exchange, in one or more examples, can include electron/holes building up static charge in the ion exchange material layer 112 and affecting carrier dynamic in the channel. For example, the channel material layer 110 accepts additional oxygen ions by intercalation, where the oxide material creates a crystalline structure and additional oxygen ions (e.g., $O^{2-}$) fit into gaps in that crystalline structure under an appropriate voltage. The voltage overcomes the repulsive force created by any electrical charge already present in the channel material layer 110, forcing more charged ions to occupy that layer.

In one or more embodiments of the present invention the reservoir material layer 114 is formed on the metal-oxide ion exchange material layer 112. In one or more embodiments of the present invention, it is specifically contemplated that the reservoir material layer 114 is a metal-oxide reservoir layer that is formed from any appropriate oxygen-containing material where oxygen ions readily dissociate under an applied voltage. One example embodiment, the material for the metal-oxide reservoir layer is cerium oxide ($CeO_2$), which reversibly converts to a nonstoichiometric oxide by emitting oxygen ions when subjected to an appropriate voltage. In one specific example, the metal-oxide reservoir layer can be formed from cerium oxide at a thickness of less than 100 nm by a thermal evaporation process. The thickness of the metal-oxide reservoir layer can be in a predetermined range. Other oxides capable of oxygen exchange such as but not limited to $WO_3$, $TiO_2$, $CuOx$, $Al_2O_3$, $Ta_2O_5$, $HfO_2$, their metals or their suboxides. The metal-oxide reservoir can also be formed using ALD, PVD, CVD, diffusion, or any other process. The metal-oxide reservoir can be a hydrogen reservoir in other examples and is composed of suitable material.

In one or more examples, the contact material layer 116 is formed from an oxygen scavenging metal, for example, Al, Be, Mg, Ca, Sr, Ba, Sc, Y, La, Ti, Zr, Hf, Dy, Lu, Er, Pr, Ce. The oxygen scavenging material can also be an alloy material such as Ti-rich TiN, TiN/Al(C)/TiN TiN/TiAl(C)/TiN, TiN/Ti(C). Alternatively, in one or more embodiments of the present invention, the contact material layer 116 is made of a material that is inert with respect to the oxygen vacancy exchange, for example, TiN, TaN, W. Alternatively, in one or more embodiments of the present invention, the contact material layer 116 is made of a material that is a hydrogen catalyst or source. In case a scavenging material is used, the contact material layer 116 produces vacancies in the oxide layers underneath. Because existence of such vacancies in at least one of the layers of the device during operation facilitates the exchange of non-metal ions (oxygen ions), sub-stoichiometric oxide(s) result from one or more of the following: layer(s) deposited as sub-stoichiometric, chemical reaction with the scavenging write electrode, electro-forming by current-induced local heating. A potentiation between the channel material layer 110, the bottom terminal 102 and the pedestal contact 104, and the contact material layer 116, yield oxygen (vacancy) exchange between the channel material layer 110 and the insulating ion exchange material layer 112 (similar to an electrolyte).

The contact material layer 116 is of a predetermined thickness, for example, of about 100 nm using thermal evaporation. It should be noted that the contact material layer 116 can be made using any other oxygen scavenging material using any appropriate process other than those described herein.

Figure 4:
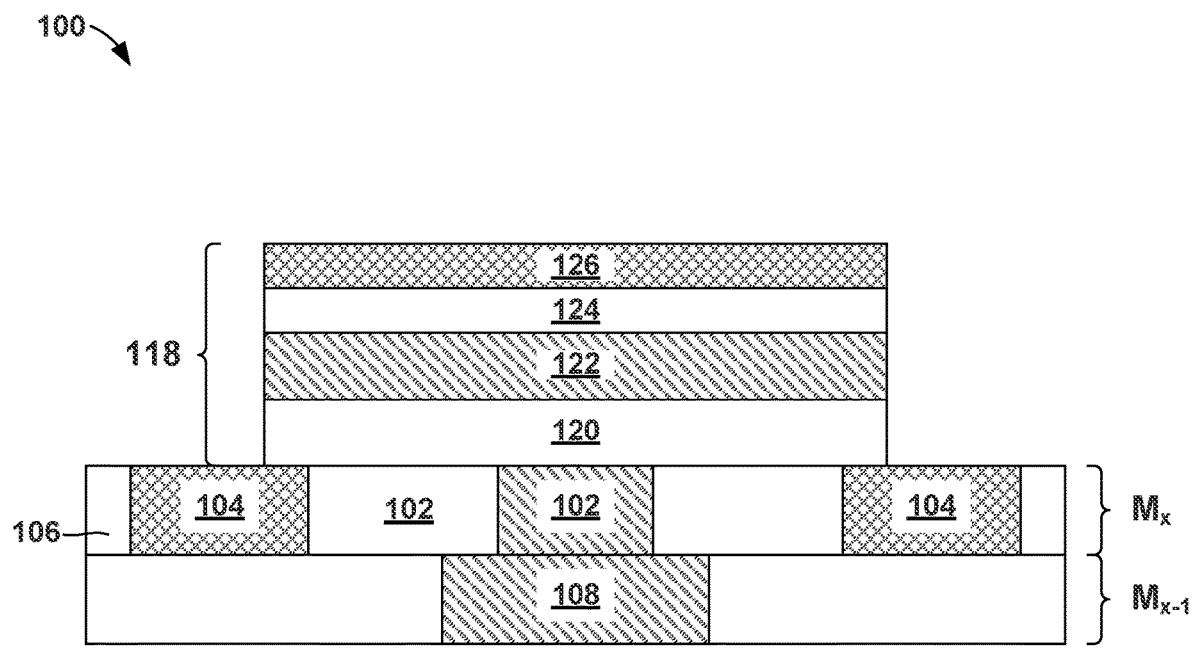

Referring now to FIG. 4, the memory structure 100 is shown after patterning the channel material layer 110, the ion exchange material layer 112, the reservoir material layer 114, and the contact material layer 116 to form a multi-level nonvolatile electrochemical cell or a memory cell 118 in accordance with an embodiment of the present invention. The memory cell 118 includes a channel 120, an ion exchange layer 122, a reservoir 124, and a top contact 126. Formation of the memory cell 118 is accomplished by applying a lithographic pattern to the top of the stack of layers, followed by an anisotropic etch, such as RIE, to remove the unpatterned portions of the stack. When patterning, it is important to ensure contact, or electrical continuity, between the channel 120 and the pedestal contact 104.

Figure 5:
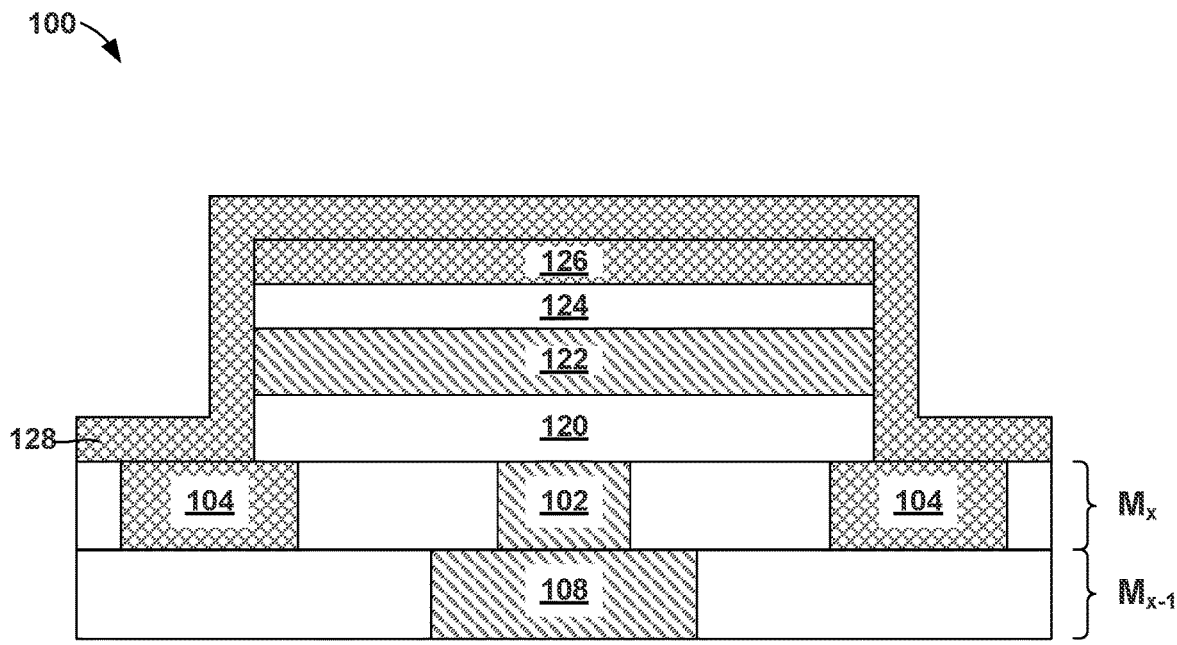

Referring now to FIG. 5, the memory structure 100 is shown after forming a metal contact layer 128 in accordance with an embodiment of the present invention. In doing so, the metal contact layer 128 is conformally deposited directly on exposed surfaces of the memory structure 100, as illustrated. By "conformal" it is meant that a material layer has a continuous thickness. For example, a continuous thickness generally means a first thickness as measured from a bottom surface to a topmost surface that is the same as a second thickness as measured from an inner sidewall surface to an outer sidewall surface.

The metal contact layer 128 can be formed by any conformal deposition technique including, for example, chemical vapor deposition (CVD), plasma enhanced chemical vapor deposition (PECVD), physical vapor deposition (PVD), sputtering, or atomic layer deposition (ALD). The metal contact layer 128 can be made from any conductive materials known in the art, such as, for example, titanium, tungsten, nickel, molybdenum, tantalum, copper, silver, gold, ruthenium, iridium, rhenium, rhodium, and alloys thereof. In at least one embodiment, the metal contact layer 128 is titanium nitride deposited using an ALD technique.

In an embodiment, the metal contact layer 128 can have a thickness in a ranging from approximately 5 nm to approximately 50 nm. Other thicknesses that are lesser than, or greater than, the aforementioned thickness range can also be employed for the metal contact layer 128. In all cases the metal contact layer 128 should be deposited with a thickness to maximize cell performance, minimize resistance, and maintain the two-terminal cell footprint.

Figure 6:
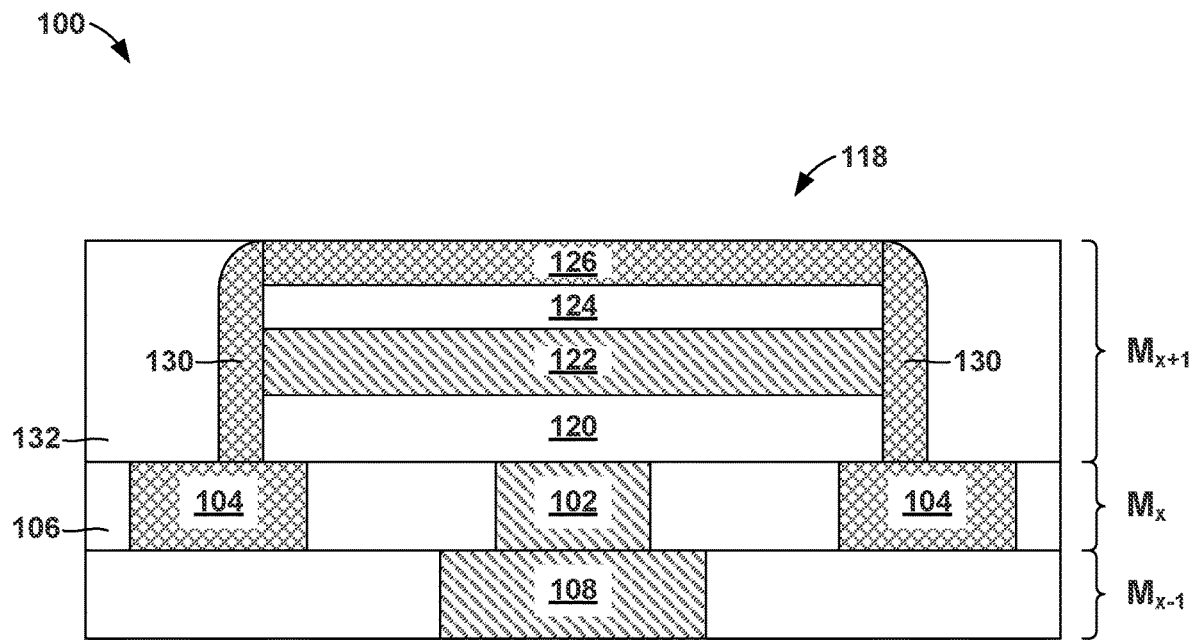

Referring now to FIG. 6, the memory structure 100 is shown after recessing the metal contact layer 128 to form vertical conductors 130 and forming an $M_{x+1}$ dielectric 132 in accordance with an embodiment of the present invention.

First, the metal contact layer 128 can be recessed or etched to produce the vertical conductors 130. In practice, the metal contact layer 128 can be etched using any suitable method, such as a wet etch, a dry etch, or a combination of sequential wet and/or dry etches. In an embodiment, for example, the metal contact layer 128 is recessed using an anisotropic etch such as, for example, reactive ion etching. In doing so, portions of the metal contact layer 128 are removed to expose top surfaces of the memory cell 118 (e.g. the top contact 126), the pedestal contact 104, and the $M_x$ dielectric 106. Recessing the metal contact layer 128 is selective to the top contact 126, the pedestal contact 104 and the $M_x$ dielectric 106, and stops once the top contact 126 is exposed. Portions of the metal contact layer 128 remaining along sidewalls of the memory cell 118 create the vertical conductors 130, as illustrated in the figure. It is noted that some amount of over etch is acceptable so long as the vertical conductors 130 remain in direct contact with sides of the top contact 126.

Next, the $M_{x+1}$ dielectric 132 may be formed using any suitable dielectric deposition techniques followed by a chemical mechanical polishing technique to planarize the $M_{x+1}$ dielectric 132 with the top contact 126. After planarization, the top surface of the $M_{x+1}$ dielectric 132 is flush, or substantially flush, with the top surface of the top contact 126. In general, the $M_{x+1}$ dielectric 132 is substantially similar to the $M_x$ dielectric 106 described above.

Each vertical conductor 130 forms an electrical connection between the pedestal contact 104 in the $M_x$ layer to the top contact 126 in the $M_{x+1}$ layer. More specifically, each vertical conductor 130 forms an electrical connection, or current path, from a top surface of the pedestal contact 104 to a sidewall of the top contact 126. Furthermore, the vertical conductors 130 are self-aligned with and directly contact sidewalls of the channel 120, the ion exchange layer 122, or the reservoir 124. In an embodiment, the pedestal contacts 104 can be eliminated entirely since the vertical conductors 130 directly contact sidewalls of the channel 120.

Figure 7:
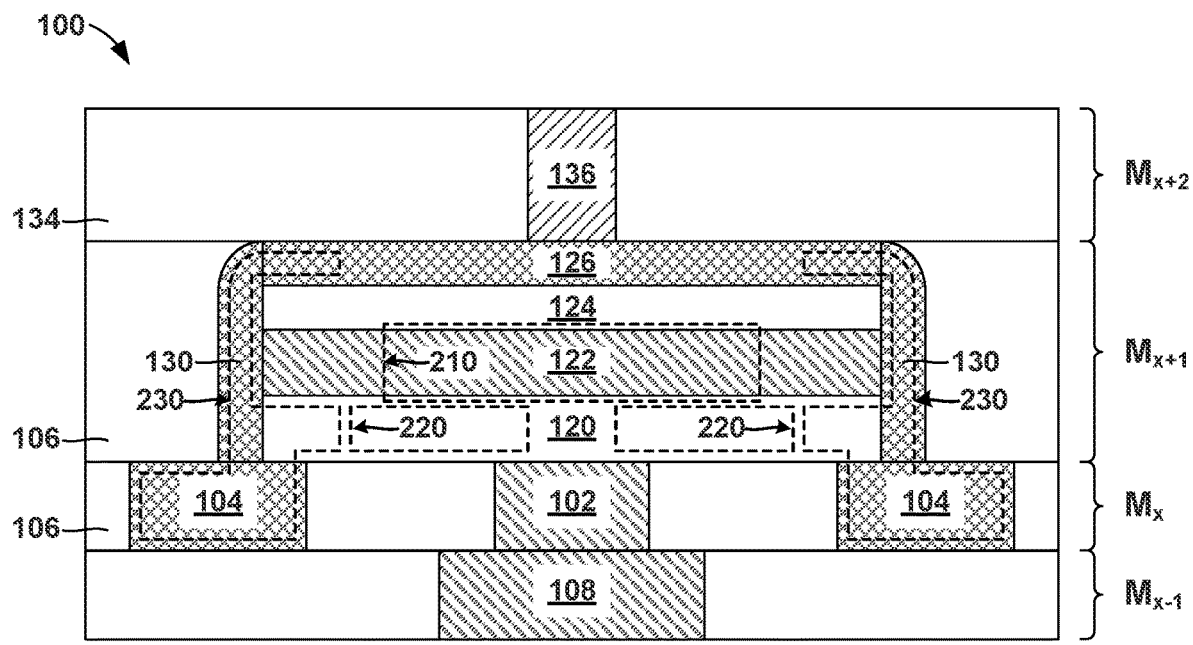

Referring now to FIG. 7, the memory structure 100 is shown after forming an $M_{x+2}$ dielectric 134 and a top terminal 136 in accordance with an embodiment of the present invention.

In general, the $M_{x+2}$ dielectric 134 is substantially similar to the $M_x$ dielectric 106 described above. After being deposited, the $M_{x+2}$ dielectric 134 can be patterned and etched by any appropriate lithographic process to form regions, or trenches, in which the top terminal 136 is formed.

The top terminal 136 can be a single via formed from metal, metal nitride, or some combination thereof. In one or more embodiments of the present invention the top terminal 136 is made using tungsten at a thickness of about 50 nm; however, it should be understood that any appropriate material and thickness can be used, including for example tungsten, nickel, molybdenum, tantalum, copper, silver, gold, ruthenium, iridium, rhenium, rhodium, and alloys thereof. In one or more embodiments of the top terminal 136 can be formed by an appropriate physical vapor deposition technique, whereby a sputtering apparatus can include electron-beam evaporation, thermal evaporation, direct-current diode systems, radio frequency sputtering, magnetron sputtering, or ionized metal plasma sputtering. The top terminal 136 may be part of, or connect to, a word line in a cross-point array, as described below with reference to FIG. 11.

Following deposition, a chemical mechanical polishing technique is used to remove excess material above the $M_{x+2}$ dielectric 134, forming a substantially planar surface across the $M_{x+2}$ dielectric 134 and the top terminal 136.

Figure 8:
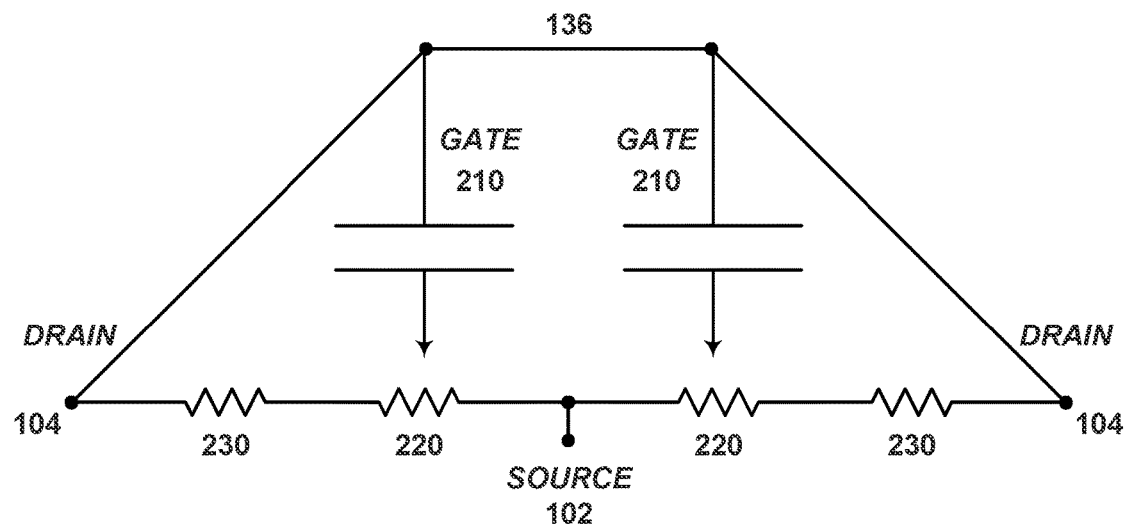
FIG. 8 depicts an electrical wiring diagram of the memory structure, according to an exemplary embodiment.

Referring now to FIG. 8, an electrical wiring diagram of the memory structure 100 is shown in accordance with an embodiment of the present invention. The memory structure 100 may include a programming gate 210 (or charge exchange layer), a variable resistor 220, and a fixed resistor 230, each of which is superimposed on the structure illustrated in FIG. 7.

The programming gate 210 may be a portion of the ion exchange layer 122 capable of transferring ions into the channel 120, having a gate electrode that includes either the reservoir 124 and the top contact 126. The variable resistor 220 may be a portion of the channel 120, and a location of the variable resistor 220 may be further based on the location where ions may be transferred from in the ion exchange layer 122. The fixed resistor 230 may include another portion of the channel 120 in contact with the pedestal contact 104 and the vertical conductor 130.

Figure 9:
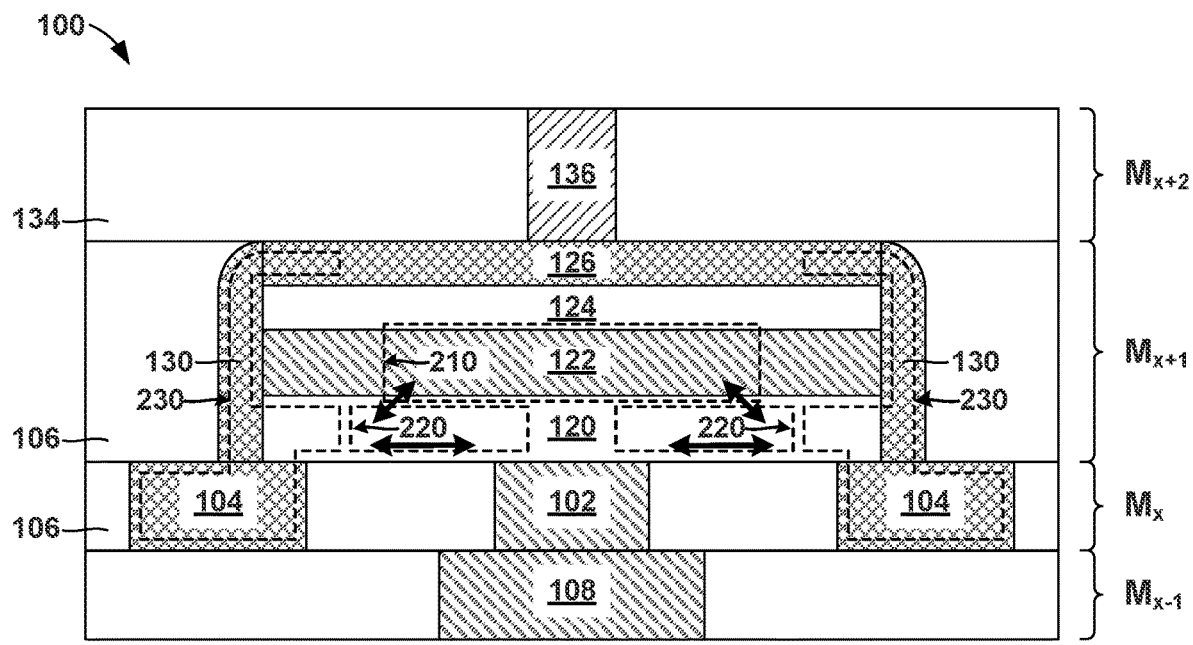
FIG. 9 depicts a movement of charged elements through the memory structure during a write operation, according to an example embodiment.

Referring now to FIG. 9, the memory structure 100 is show during a write operation. During a write operation, a first voltage is applied across the top terminal 136 and the bottom terminal 102. The first voltage is selected so that a sufficient potential is created between the top terminal 136 and the channel 120, which may cause non-metal ions, for example oxygen ions, to migrate between the channel 120 and the ion exchange layer 122. For example, the first voltage may range from about 1V to about 5V. Such migration of ions allows the memory structure 100 to produce a movement of ions that is not in the direction of current flow during a read operation. Additionally, because the top contact 126 is electrically connected to the pedestal contact 104 via the vertical conductor 130, current will flow between the pedestal contact 104 and the bottom terminal 102. It should be noted that the arrows depicted in FIG. 9 show the movement of ions from the ion exchange layer 122, as well as the flow of current along the channel 120.

Figure 10:
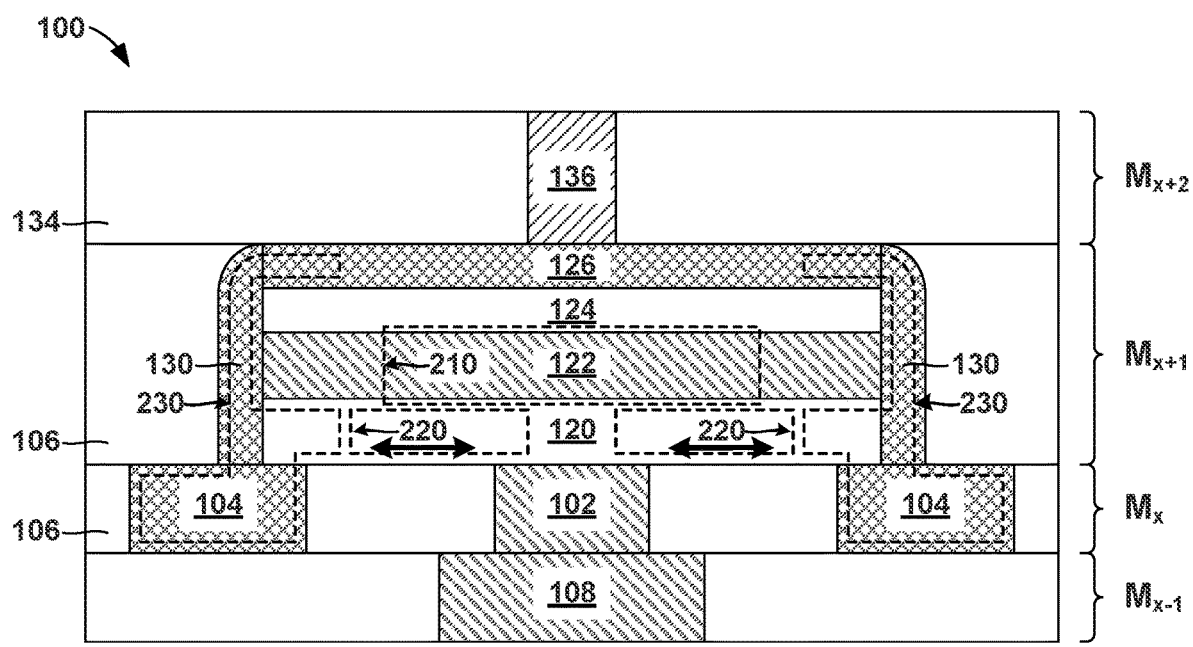
FIG. 10 depicts a movement of charged elements through the memory structure during a read operation, according to an example embodiment.

Referring now to FIG. 10, the memory structure 100 is show during a read operation. During a read operation, a second voltage may be used which is substantially less than the first voltage. For example, the second voltage may range from about 50 mV to about 250 mV. The resulting change of resistance of the channel 120 may be measured based on the flow of current between the bottom terminal 102 and the pedestal contact 104. It should be noted that the second voltage for used for read operations may be substantially less than the first voltage used for write operations, such that the movement of ions described above with respect to FIG. 9 does not occur.

Figure 11:
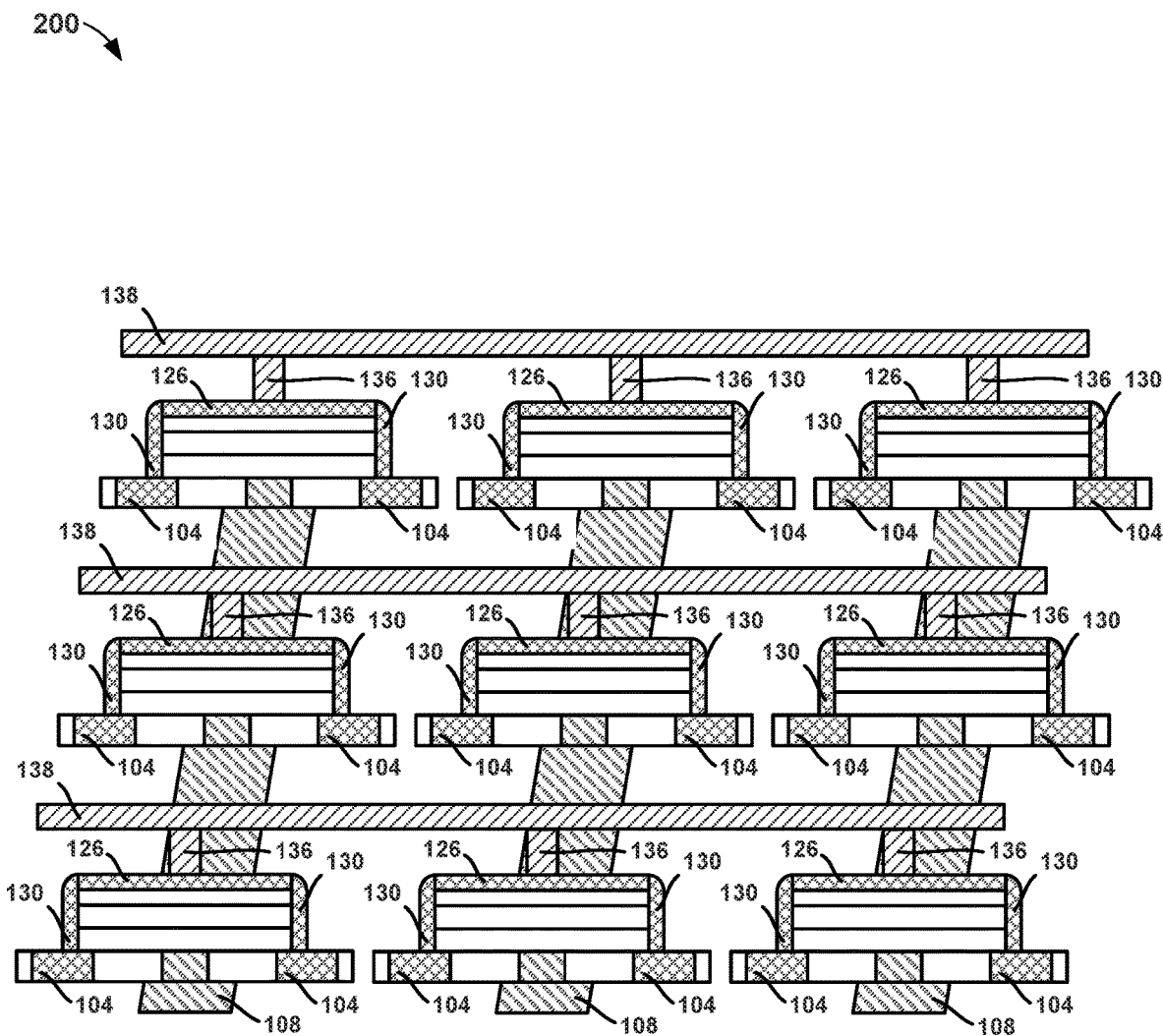
FIG. 11 depicts a plurality of memory structures arranged in a cross-point array, according to an example embodiment.

Referring now to FIG. 11, the memory structure 100 of FIG. 7 is shown as part of a cross-point array 200, as may be used in analog computing, in accordance with an embodiment of the present invention. The cross-point array 200 of FIG. 11 includes nine of the memory structure 100 connected in an array with a word line 138 and a bit line 108. More specifically, the bit line 108 is the bottom metal line 108 and forms an electrical connection between bottom terminal 102 of adjacent memory structures 100. Meanwhile, the word line 138 is a metal line or trace and forms an electrical connection between top terminals 136 of adjacent memory structures 100.

It is noted that some components of individual memory structures 100 are omitted from cross-point array 200, while other components of individual memory structures 100 are shown in the cross-point array 200 for clarity and illustrative purposes only. It is further noted that reference numerals corresponding to some components of individual memory structures 100 are omitted from the cross-point array 200, while reference numerals for other components of individual memory structures 100 are shown in the cross-point array 200 for clarity and illustrative purposes only.

Figure 12:
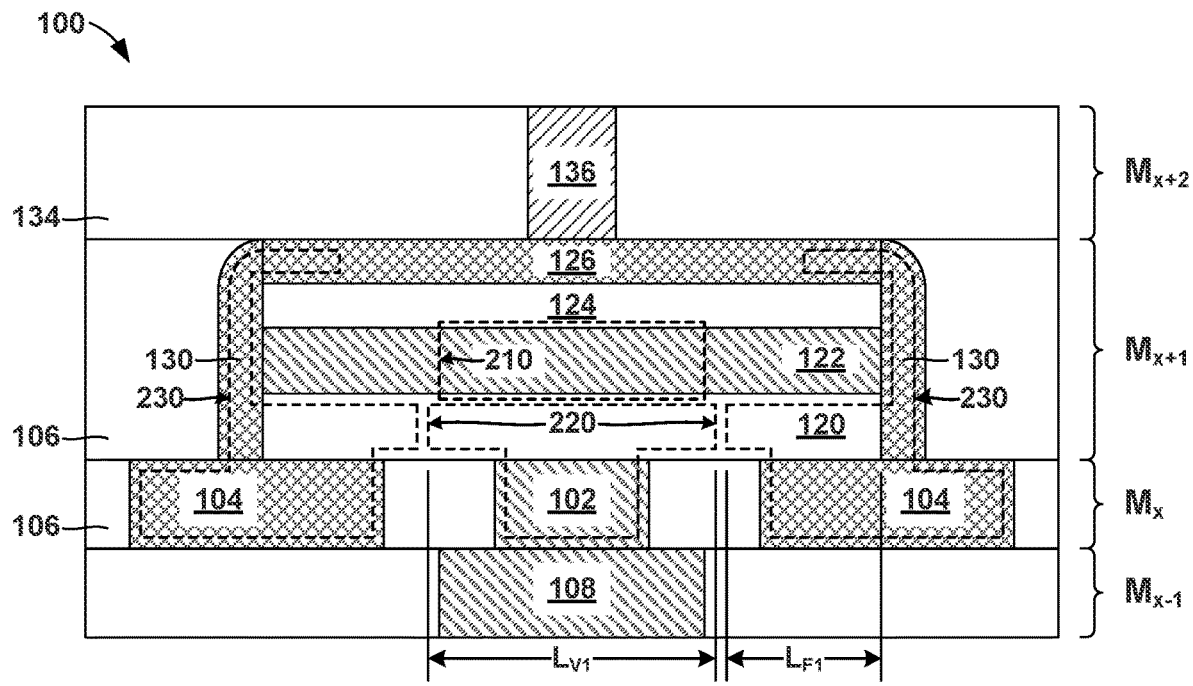
FIGS. 12-15 depict cross-sectional views of the memory structure, according to multiple alternative exemplary embodiments.
Figure 13:
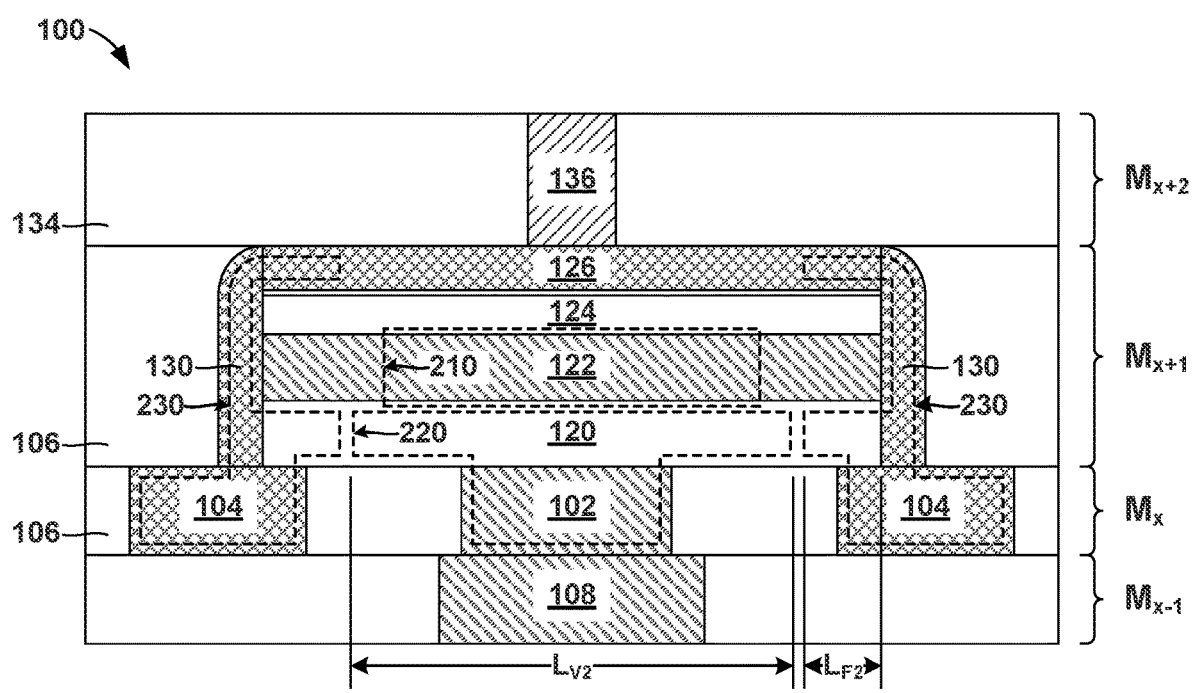

Referring now to FIG. 12 and FIG. 13, the elements of the electrical wiring diagram of FIG. 8 are superimposed on multiple example embodiments of the memory structure 100 in accordance with an embodiment of the present invention. As described below, the electrical characteristics of the memory structure 100 may be adjusted based on the patterning and design parameters used when fabricating the memory structure 100. Specifically, for example, the electrical characteristics of the memory structure 100 may be adjusted or tuned by adjusting the dimensions of the pedestal contact 104, the bottom terminal 102, and the vertical conductor 130, as described immediately below.

It should be noted that the shape and size of the electrical elements illustrated in the figures are approximate and intended to illustrate the concept, without being an exact representation of the characteristics and operation of the device. Specifically, two different embodiments are provided to illustrate how possible changes in geometry may achieve different electrical characteristics of the memory structure 100. It is noted, the dimensions and sizes in the figures are for illustrative purposed only and do not dictate or limit functionality of the memory structure 100.

The resistance of fixed resistor 230 can be used to tune the write characteristics of the memory structure 100. The resistance of the fixed resistor 230 in the channel 120 may be dependent on the material of the channel 120, the cross-sectional area of the channel 120, and the length $L_{F1}$ or $L_{F2}$. In such a system, the length $L_{F1}$ or $L_{F2}$ represents a portion of the channel 120 that does not experience ion migration into, or out of, the material during operation. The length $L_{F1}$ and $L_{F2}$ may be based on the portion of the pedestal contact 104 and the vertical conductor 130 which contacts the channel 120 as this may factor into where ion migration does not substantially occur from the ion exchange layer 122 into the channel 120. In the present embodiment, it should be noted that contact between the pedestal contact 104 and the channel 120 generally exists along a bottom surface of the channel 120 and contact between the vertical conductor 130 and the channel 120 generally exists along a sidewall of the channel 120. Thus, the fixed resistor 230 in the channel layer 120 may be tuned by adjusting the thickness of the channel 120 or size, material and placement of both the pedestal contact 104 and the vertical conductor 130.

The capacitance of the programming gate 210 may be dependent on the material of the ion exchange layer 122, the thickness of the ion exchange layer 122, and the area of the capacitive element, which may be related to the length of the variable resistor 220 ($L_{V1}$ or $L_{V2}$). The capacitance, and structure, of the programming gate 210 may impact the rate of ion mobility in or out of the variable resistor 220 during write operations, as well as the voltage across the programming gate 210 required to perform write operations.

The resistance of the variable resistor 220 in the channel 120 may be dependent on the material of the channel 120, the cross-sectional area of the channel 120, and the length $L_{v1}$ or $L_{V2}$, as well as a dynamic concentration of mobile ions from the ion exchange layer 122. The resistance of the variable resistor 220 is dependent on the fixed parameters of the material, the length of the variable resistor 220 ($L_{V1}$ or $L_{V2}$), and the cross-sectional area of the channel layer 120, as well as a dynamic concentration of mobile ions from the ion exchange layer 122. The length of the variable resistor 220 ($L_{V1}$ or $L_{V2}$) may be dependent on the contact area between the channel 120 and the bottom terminal 102. The dynamic concentration of mobile ions ultimately based on programming of the memory structure 100, as depicted in FIGS. 9 and 10.

Figure 14:
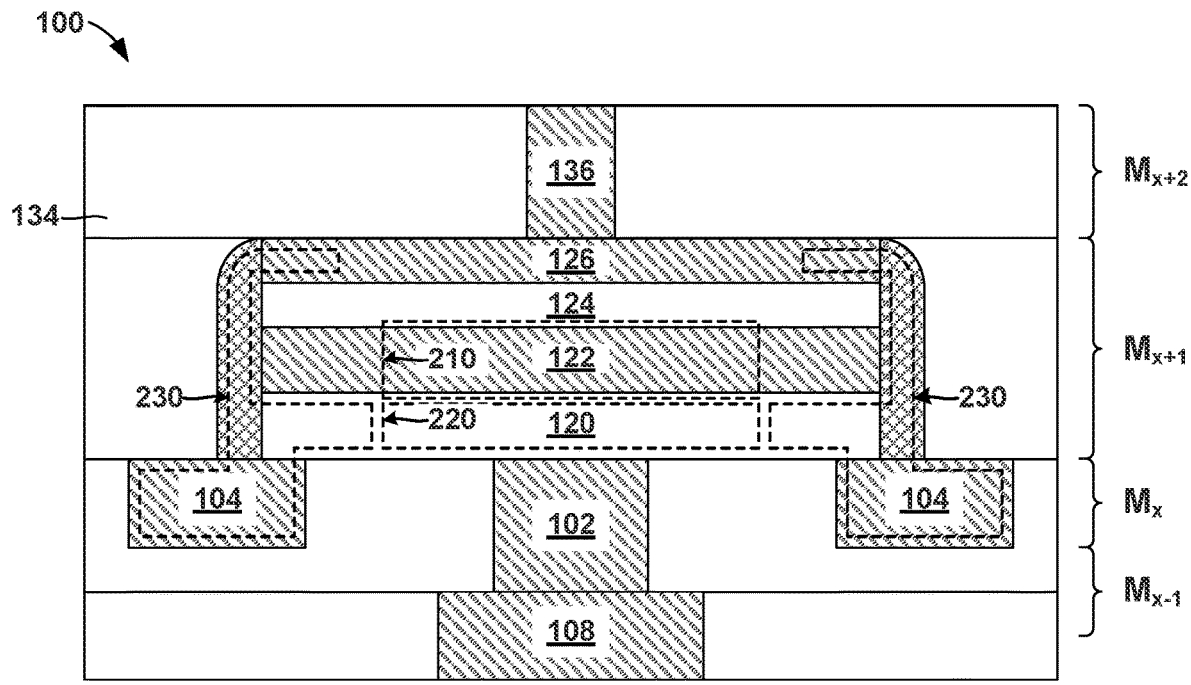
Figure 15:
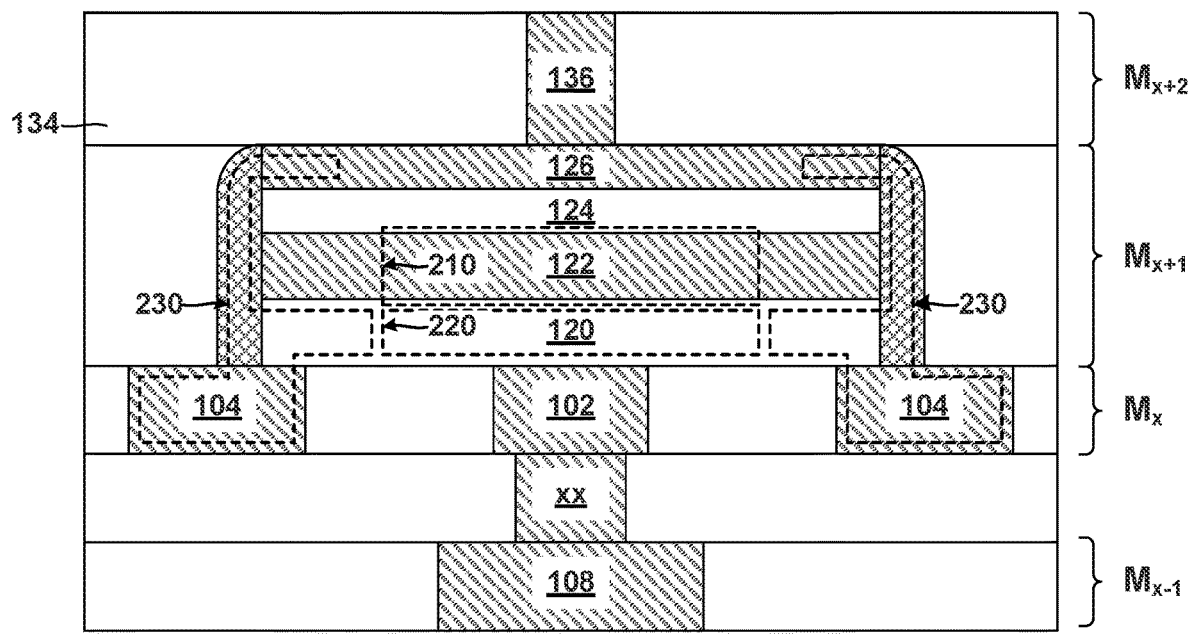

Referring now to FIG. 14 and FIG. 15, different embodiments of the memory structure 100 are shown in accordance with an embodiment of the present invention. As previously mentioned above, the bottom terminal 102 is made taller or thicker than the pedestal contact 104. Doing so provides some physical distance, or electrical isolation, between the pedestal contact 104 and the bottom metal line 108.

In the embodiments described above, separation between the pedestal contact 104 and the bottom metal line 108 may not be required because the pedestal contacts 104 are spaced apart from each other and adequately spaced from the bottom metal line 108. See FIG. 1. In contrast, separation between the pedestal contact 104 and the bottom metal line 108 may be necessary when one or multiple pedestal contacts (104), are configured such that they overlap the bottom metal line 108, like in the embodiment described below with reference to FIGS. 22-26.

Turning to FIG. 14, the bottom terminal 102 and the pedestal contact 104 may be formed in the same layer according to known techniques, for example, single damascene or dual damascene. In such cases, where they overlap, the pedestal contact 104 and the bottom metal line 108 would be separated by a distance equal to the difference between a height of the bottom terminal 102 and a height of the pedestal contact 104, the pedestal contact 104 being the shorter of the two.

Turning to FIG. 15, alternatively, an additional metal layer with a via can be inserted between the Mx layer and the Mx+1 layer to provide the requisite separation, or electrical isolation between the pedestal contact 104 and the bottom metal line 108. Although doing so will require additional steps and increase the overall height of the memory structure 100, it allows for unique configurations of the pedestal contact 104, as is discussed below.

Another embodiment by which to fabricate the self-aligned crossbar-compatible electrochemical memory cell is described in detail below by referring to the accompanying FIGS. 16-20. The following description of the present embodiment begins with the structure 100 depicted in FIG. 4.

Figure 16:
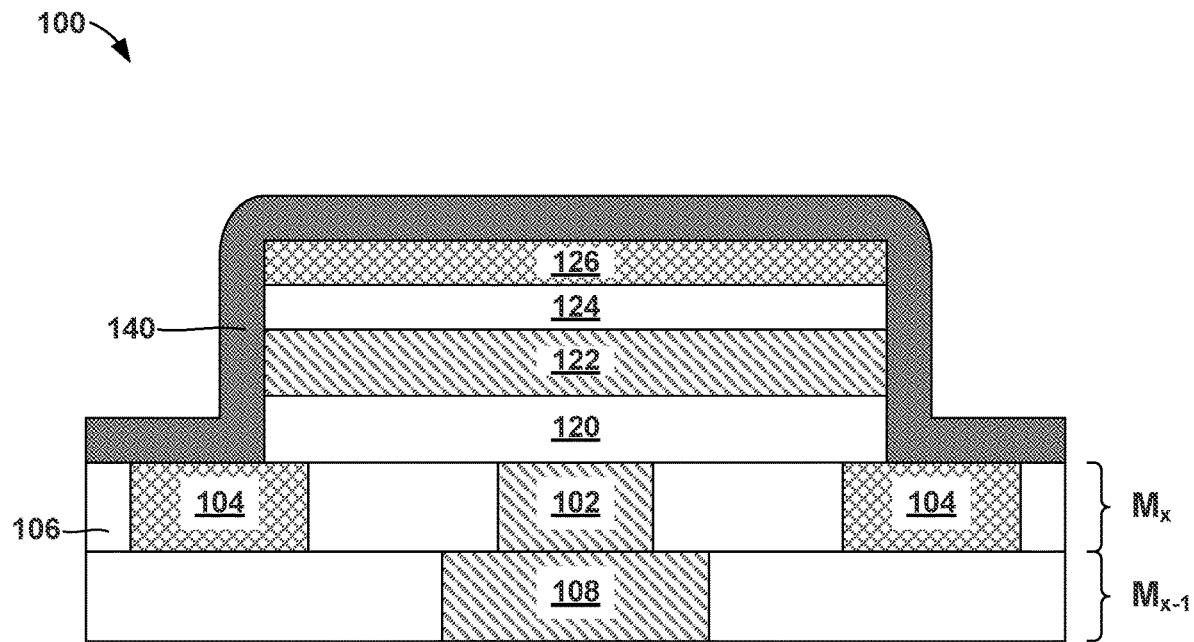
FIGS. 16-20 depict cross-sectional views of a semiconductor structure during an intermediate step of a method of fabricating a memory structure with two terminals, a programmable resistance channel, and an insulating charge-exchange gate stack, according to an alternative exemplary embodiment.

Referring now to FIG. 16, the memory structure 100 is shown after forming a dielectric layer 140 in accordance with an embodiment of the present invention. In doing so, the dielectric layer 140 is conformally deposited directly on exposed surfaces of the memory structure 100, as illustrated. The dielectric layer 140 can be formed by any conformal deposition technique including, for example, chemical vapor deposition (CVD), plasma enhanced chemical vapor deposition (PECVD), physical vapor deposition (PVD), sputtering, or atomic layer deposition (ALD). The dielectric layer 140 can be made from any dielectric materials known in the art, such as, for example, silicon nitride. In at least one embodiment, the dielectric layer 140 is aluminum oxide nitride deposited using an ALD technique.

In an embodiment, the dielectric layer 140 can have a thickness in a ranging from approximately 5 nm to approximately 50 nm. Other thicknesses that are lesser than, or greater than, the aforementioned thickness range can also be employed for the dielectric layer 140. In all cases the dielectric layer 140 should be deposited with a thickness to maximize cell performance, minimize resistance, and maintain the two-terminal cell footprint. For example, in an embodiment, the dielectric layer 140 is thick enough to electrically insulate the cell so that no electric field exists within as a result of any potential applied to an outer metal layer, as described further below.

Figure 17:
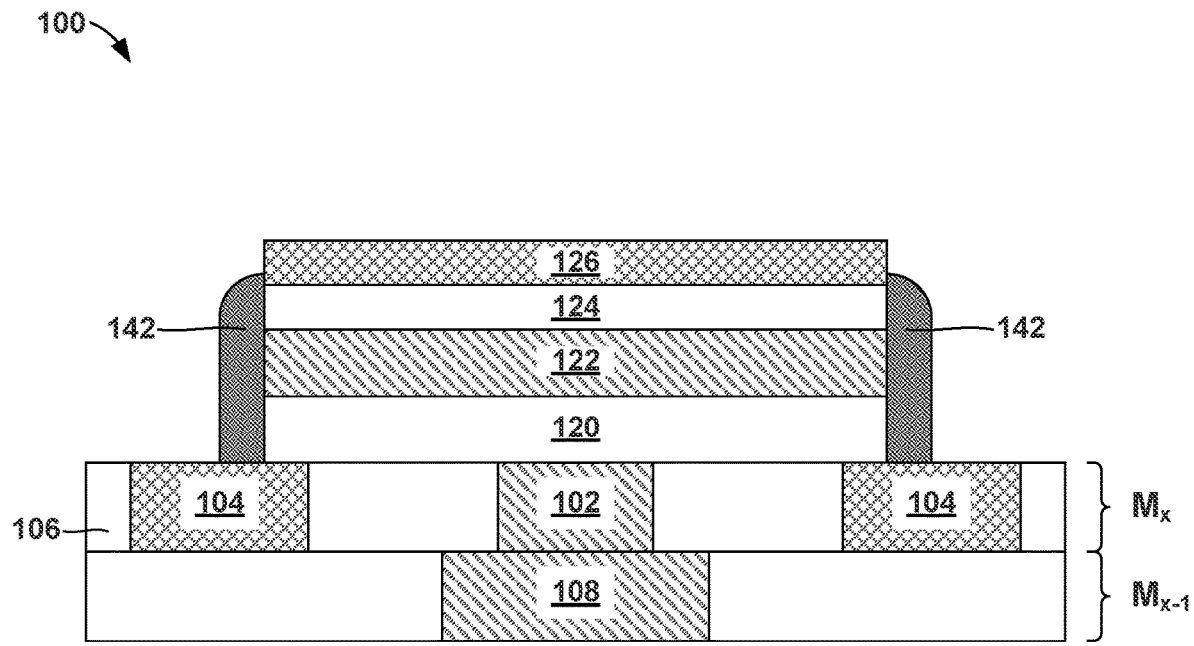

Referring now to FIG. 17, the memory structure 100 is shown after recessing the dielectric layer 140 to form dielectric spacers 142 and forming the $M_{x+1}$ dielectric 132 in accordance with an embodiment of the present invention.

First, the dielectric layer 140 can be recessed or etched to produce the dielectric spacers 142. In practice, the dielectric layer 140 can be etched using any suitable method, such as a wet etch, a dry etch, or a combination of sequential wet and/or dry etches. In an embodiment, for example, the dielectric layer 140 is recessed using an anisotropic etch such as, for example, reactive ion etching. In doing so, portions of the dielectric layer 140 are removed to expose top surfaces of the memory cell 118 (e.g. the top contact 126), the pedestal contact 104, and the $M_x$ dielectric 106. Recessing the dielectric layer 140 is selective to the top contact 126, the pedestal contact 104, and the $M_x$ dielectric 106, and stops once at least sidewalls of the top contact 126 are exposed. Portions of the dielectric layer 140 remaining along sidewalls of the memory cell 118 create the dielectric spacer 142, as illustrated in the figure. Next, the $M_{x+1}$ dielectric 132 may be formed as described above. It is noted that some amount of over etch is acceptable so long as the vertical conductors 130 remain in direct contact with sides of the top contact 126. The dielectric spacers 142 electrically isolate the memory cell 118 from the subsequently formed vertical conductors 130.

The dielectric spacers 142 enable full control of electric field lines distribution within the cell by mitigating the impact of any potential applied on the vertical self-aligned conductor (130). The ion motion during programming is exclusively controlled by the potential difference between the top terminal 126 and bottom terminal 102. The electron motion during writing is exclusively controlled by the potential difference between the pedestal contact 104 and the bottom terminal 102.

Figure 18:
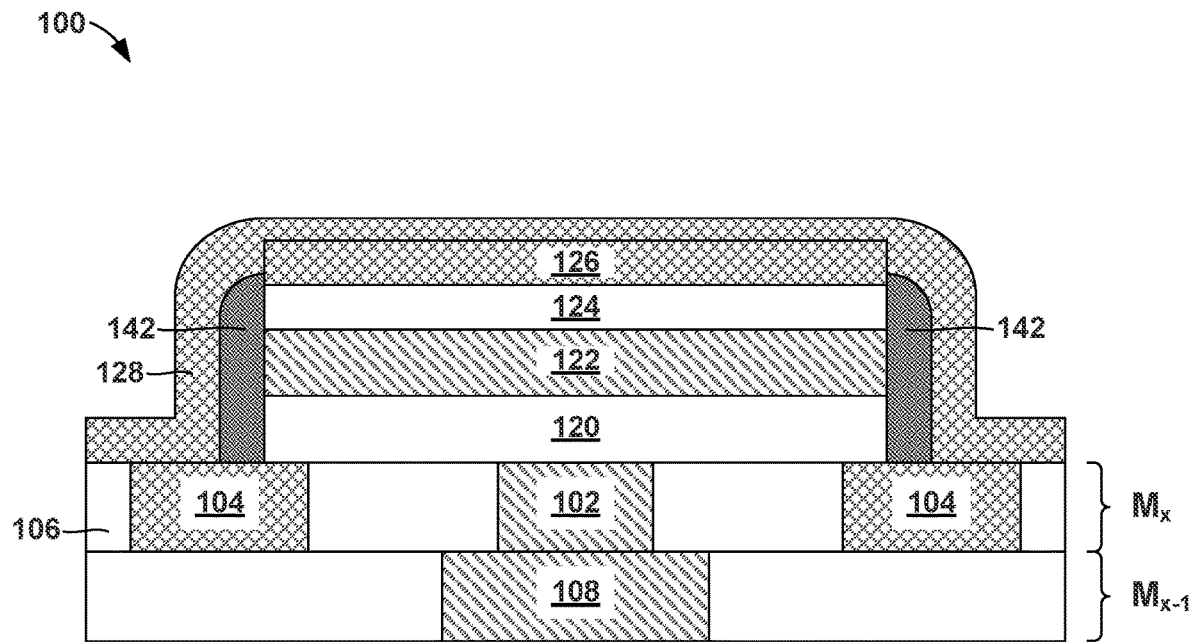

Referring now to FIG. 18, the memory structure 100 is shown after forming the metal contact layer 128 in accordance with an embodiment of the present invention, and as described in detail above.

Figure 19:
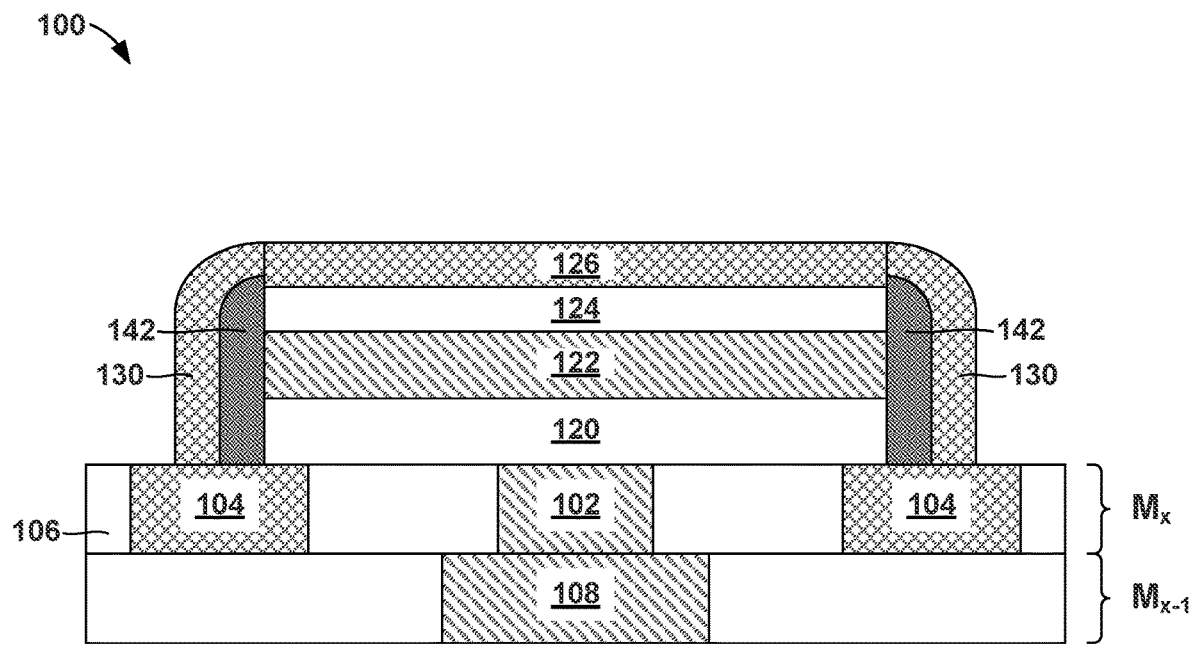

Referring now to FIG. 19, the memory structure 100 is shown after recessing the metal contact layer 128 to form the vertical conductors 130 and forming the $M_{x+1}$ dielectric 132 in accordance with an embodiment of the present invention, and as described in detail above. It is an object of all embodiments of the present invention for the vertical conductors 130 to be in electrical continuity with the top contact 126. Therefore, it is critical for the dielectric layer 140 to be recessed low enough to guarantee continuity between the vertical conductors 130 and the top contact 126.

Figure 20:
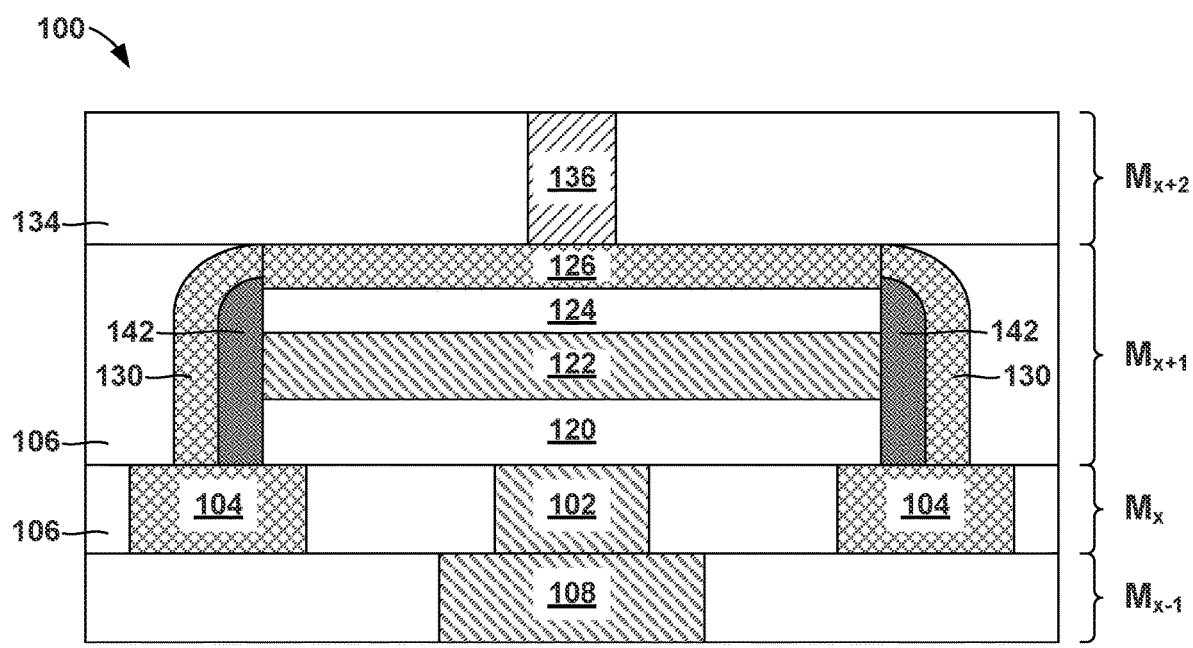

Referring now to FIG. 20, the memory structure 100 is shown after forming the $M_{x+2}$ dielectric 134 and the top terminal 136 in accordance with an embodiment of the present invention, and as described in detail above.

It is noted, addition of the dielectric spacers 142 will adjust the geometry and configuration and relationship between the various components of the memory structure 100. For example, the vertical conductors 130 no longer contact the channel 120, and current cannot flow directly from the channel 120 to the vertical conductors 130, as is possible without the dielectric spacers 142. As such, addition of the dielectric spacers 142 will affect tuning of the device. For example, as previously described above the dielectric spacers 142 enable full control of electric field lines distribution within the cell by mitigating the impact of any potential applied on the vertical self-aligned conductor (130).

Referring now to FIGS. 21-26, cross-section views of the memory structure 100 are provided to illustrate alternative embodiments. The cross-section views mimic the top-down view of FIG. 1 and show different configurations of the pedestal contact 104 in relation to various configurations of the bottom metal line 108, the memory cell 118, and the vertical conductors 130, each represented with dotted lines. In each of the embodiments described below, the contact area between the channel 120 and the pedestal contact 104 will be different and ultimately affect the functionally of the memory structure 100.

The ability to adjust the size and shape of the pedestal contacts and adjust their connectivity enables designing a cell of given resistance and dynamic range without affecting the footprint. For example, a circular cell (FIG. 24) will have a significantly larger ON current (lower overall resistance) than the cell illustrated in FIG. 1.

Figure 21:
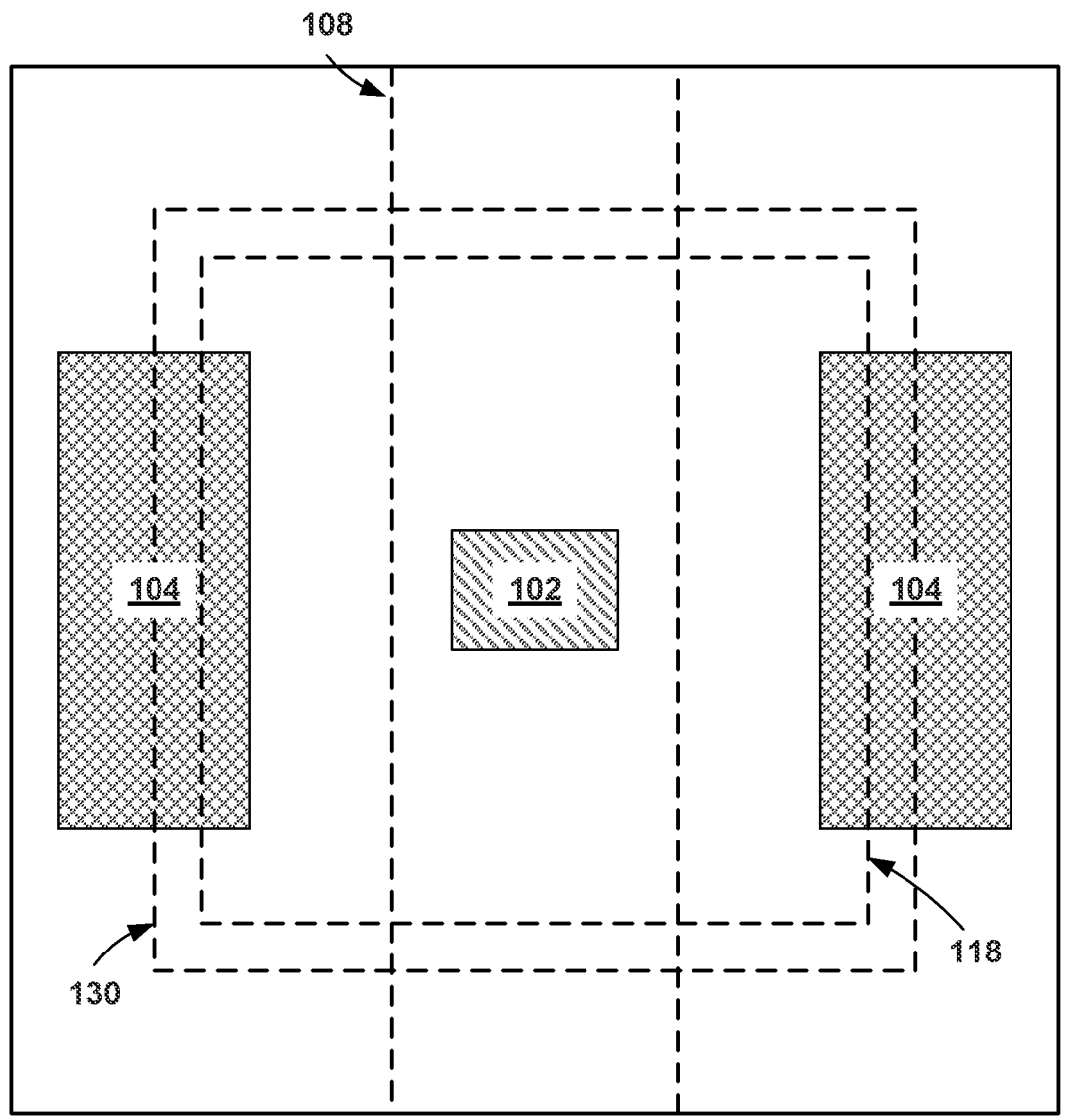
FIGS. 21-26 depict cross-sectional views of the memory structure, according to multiple alternative exemplary embodiments.

Turning to FIG. 21, the memory structure 100 is shown with two pedestal contacts 104 and a square or substantially square memory cell 118 in accordance with an embodiment of the present invention. In this embodiment, the two pedestal contacts 104 are rectangular or substantially rectangular and separate from one another.

Figure 22:
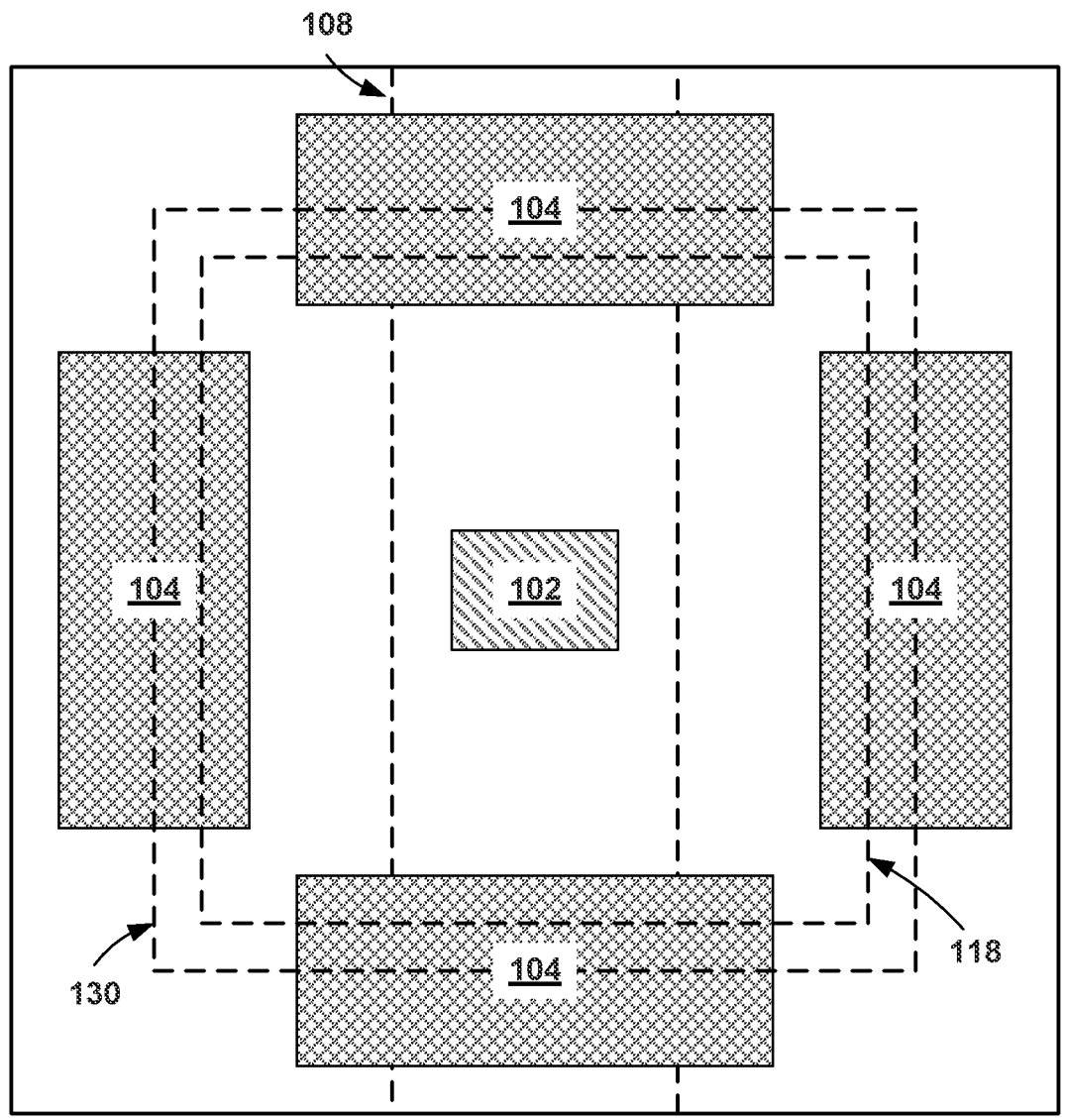

Turning to FIG. 22, the memory structure 100 is shown with four pedestal contacts 104 and a square or substantially square memory cell 118 in accordance with an embodiment of the present invention. In this embodiment, the four pedestal contacts 104 are rectangular or substantially rectangular and separate from one another. In the present embodiment, two of the four pedestal contacts 104 overlap the bottom metal line 108, and some form of electrical insulation between the two may be required, as previously disclosed above with reference to FIGS. 14 and 15.

Figure 23:
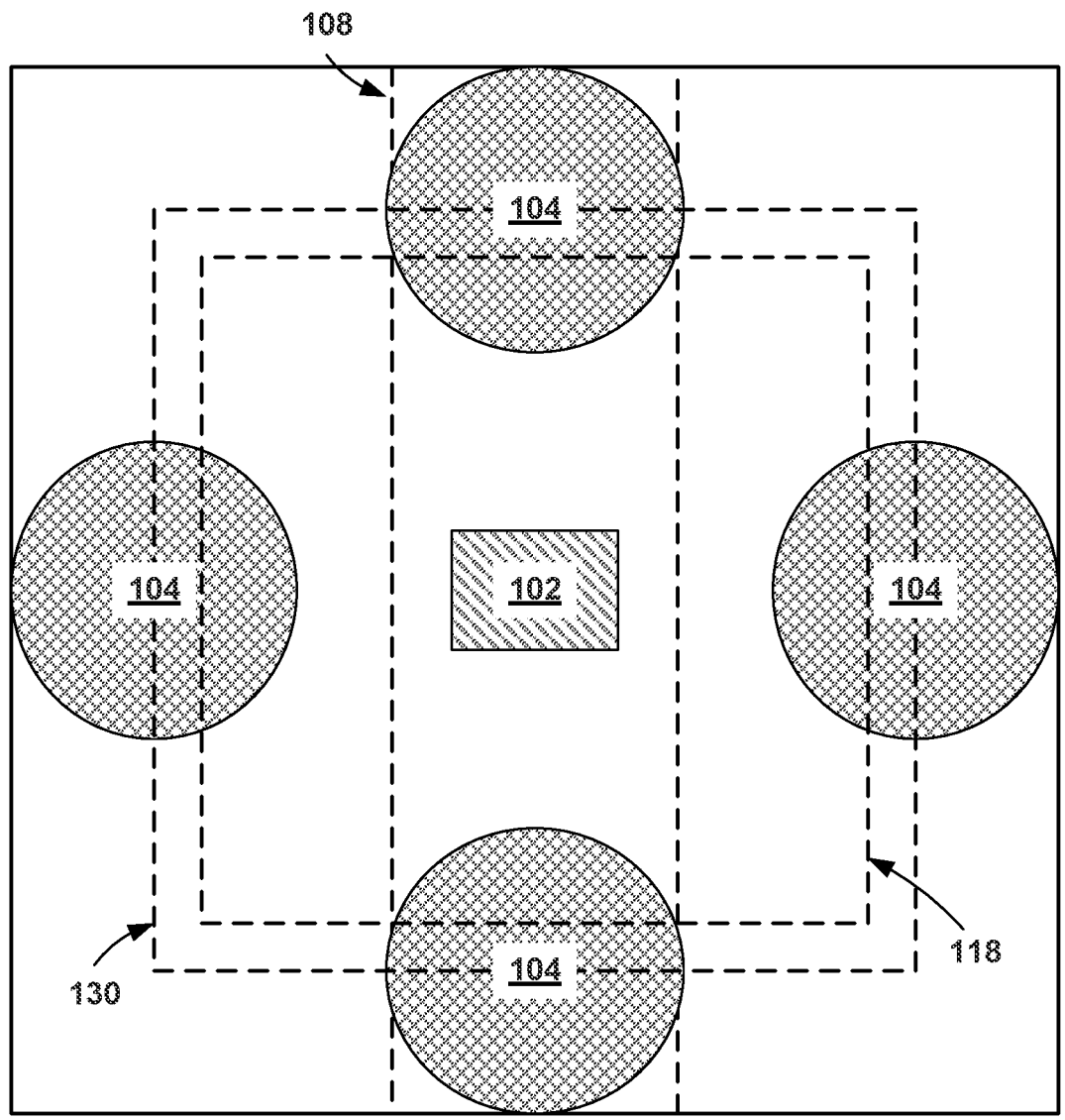

Turning to FIG. 23, the memory structure 100 is shown with four pedestal contacts 104 and a square or substantially square memory cell 118 in accordance with an embodiment of the present invention. In this embodiment, the four pedestal contacts 104 are round or substantially round and separate from one another. In the present embodiment, two of the four pedestal contacts 104 overlap the bottom metal line 108, and some form of electrical insulation between the two may be required, as previously disclosed above with reference to FIGS. 14 and 15.

Figure 24:
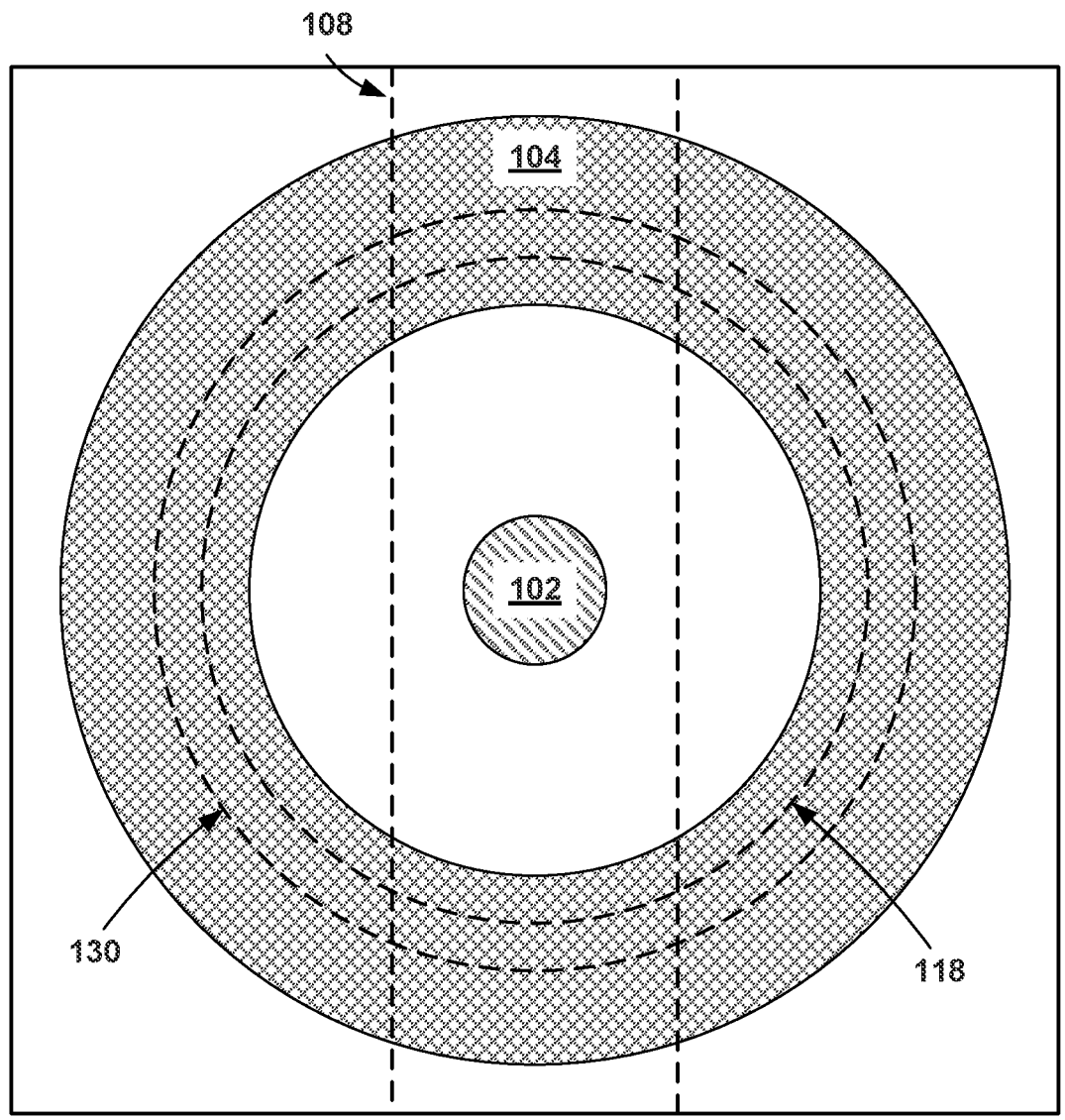

Turning to FIG. 24, the memory structure 100 is shown with a single pedestal contact 104 and a round or substantially round memory cell 118 in accordance with an embodiment of the present invention. In this embodiment, the single pedestal contact 104 is also round or substantially round and roughly mimics the size and shape of the memory cell 118. In the present embodiment, the single pedestal contact 104 overlaps the bottom metal line 108, and some form of electrical insulation between the two may be required, as previously disclosed above with reference to FIGS. 14 and 15.

Figure 25:
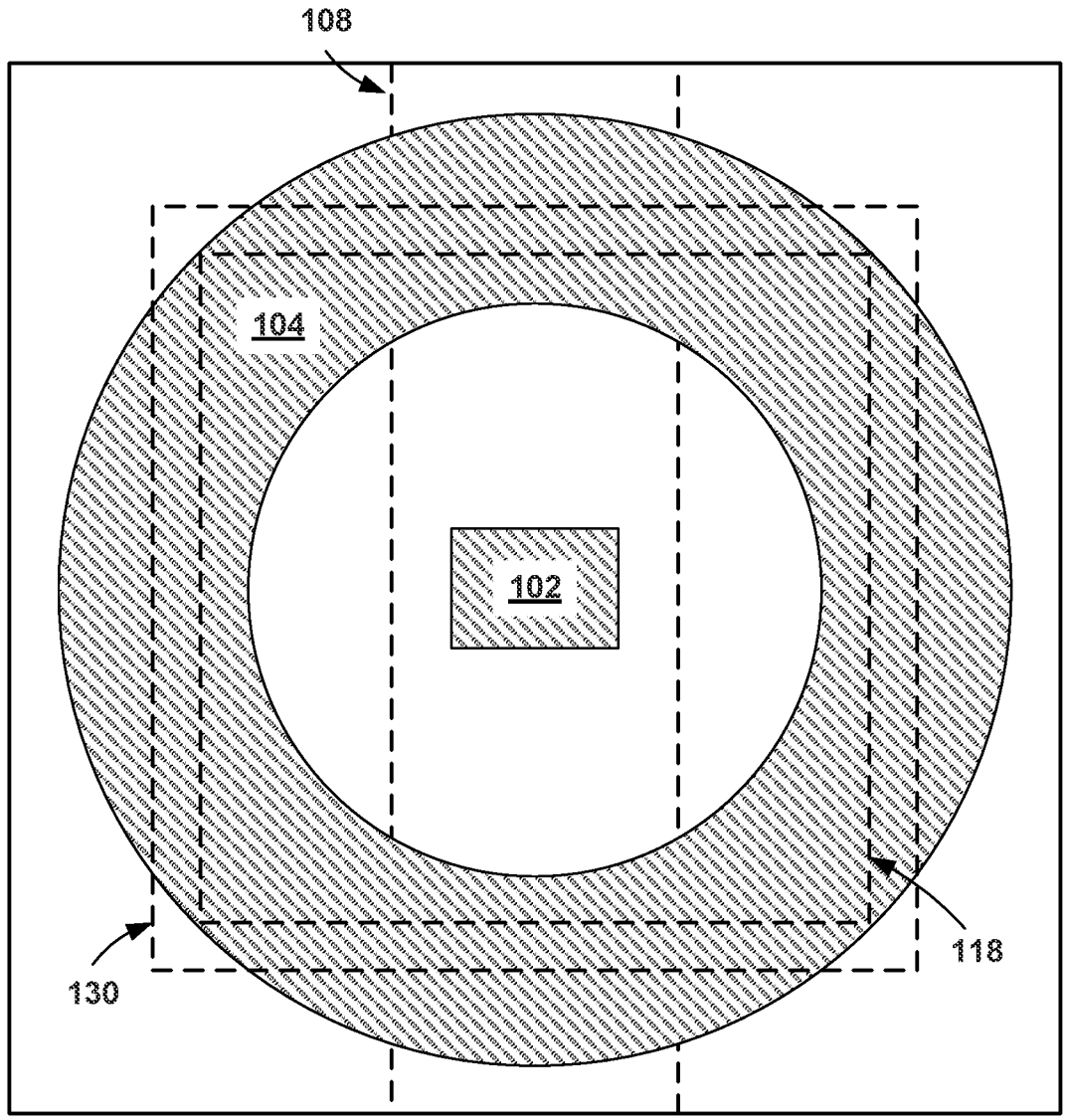

Turning to FIG. 25, the memory structure 100 is shown with a single pedestal contact 104 and a square or substantially square memory cell 118 in accordance with an embodiment of the present invention. In this embodiment, the single pedestal contact 104 is round or substantially round. In the present embodiment, the single pedestal contact 104 overlaps the bottom metal line 108, and some form of electrical insulation between the two may be required, as previously disclosed above with reference to FIGS. 14 and 15.

Figure 26:
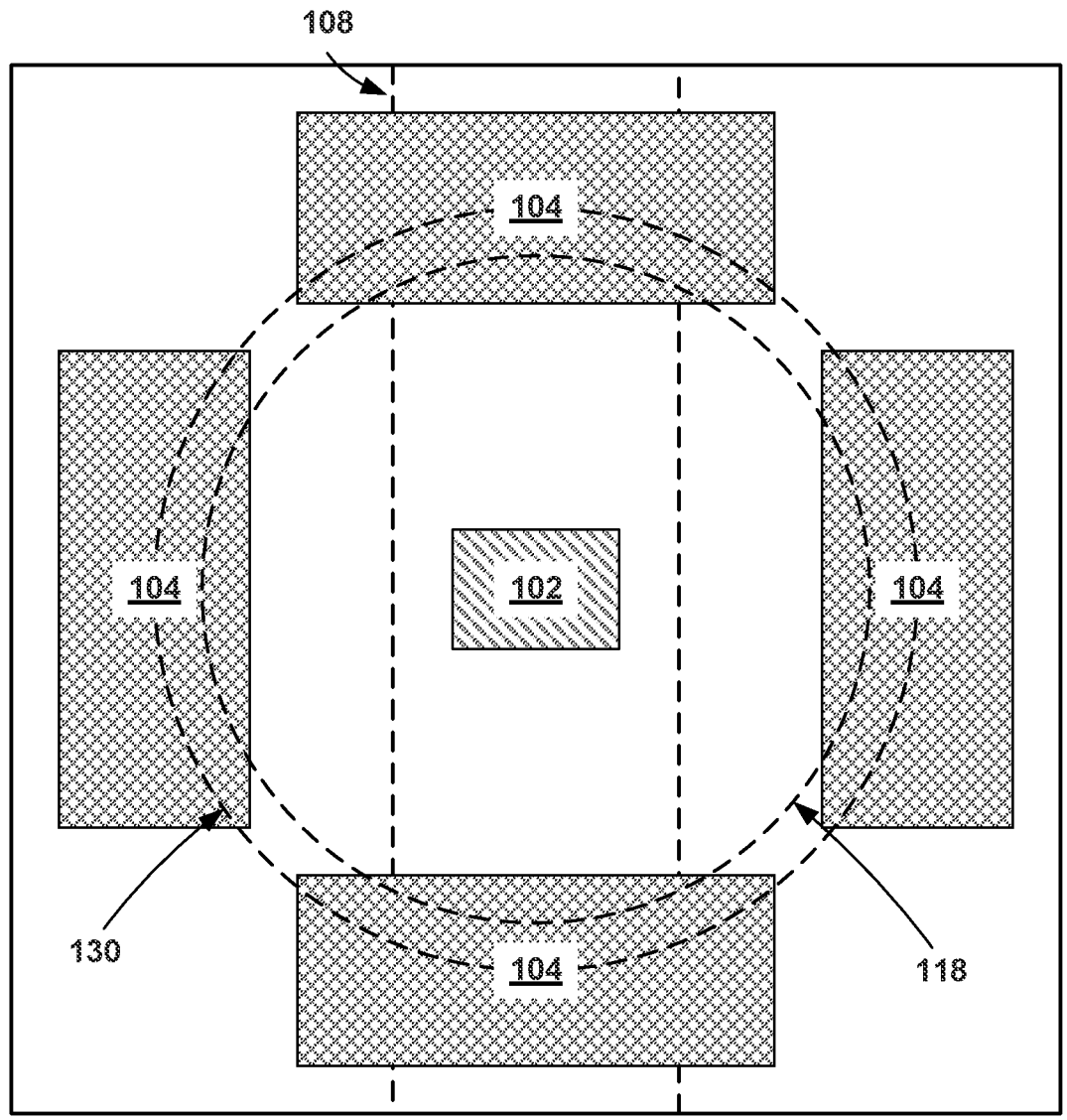

Turning to FIG. 26, the memory structure 100 is shown with four pedestal contacts 104 and a round or substantially round memory cell 118 in accordance with an embodiment of the present invention. In this embodiment, the four pedestal contacts 104 are rectangular or substantially rectangular and separate from one another. In the present embodiment, two of the four pedestal contacts 104 overlap the bottom metal line 108, and some form of electrical insulation between the two may be required, as previously disclosed above with reference to FIGS. 14 and 15.

Additional embodiments having similar features as described above with reference to FIGS. 21-26 in any combination, any number, and any shape and size are explicitly contemplated. In one example, the memory structure 100 includes any number of pedestal contacts 104. In another example, the memory structure 100 includes one or more pedestal contacts 104 having any shape or combination of shapes. In yet another example, the memory structure 100 includes a single bottom terminal 102 having any shape or size.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A memory structure comprising:
    a top terminal;
    a multi-level nonvolatile electrochemical cell;
    a bottom terminal;
    a pedestal contact in the same metal level as the bottom terminal; and
    a vertical conductor fully self-aligned to the multi-level nonvolatile electrochemical cell and extending vertically from the pedestal contact.

2. The structure of claim 1, further comprising:
    a dielectric sidewall spacer separating the multi-level nonvolatile electrochemical cell from the self-aligned vertical conductor.

3. The structure of claim 1, wherein the top terminal comprises a single via.

4. The structure of claim 1, wherein a height of the self-aligned vertical conductor is equal to a height of the multi-level nonvolatile electrochemical cell.

5. The structure of claim 1, wherein the self-aligned vertical conductor directly contacts sidewalls of the multi-level nonvolatile electrochemical cell.

6. The structure of claim 1, wherein the pedestal contact comprises multiple individual contact structures.

7. The structure of claim 1, wherein the pedestal contact is a single congruent structure.

8. The structure of claim 1, wherein the pedestal contact surrounds the bottom terminal.

9. A memory structure comprising:
    a top terminal contacting a top contact;
    a multi-level nonvolatile electrochemical cell;
    a bottom terminal contacting a variable resistance channel of the multi-level nonvolatile electrochemical cell;
    a pedestal contact in the same metal level as the bottom terminal and contacting the variable resistance channel of the multi-level nonvolatile electrochemical cell; and
    a vertical conductor fully self-aligned to the multi-level nonvolatile electrochemical cell and extending vertically between the pedestal contact and the top contact.

10. The structure of claim 9, further comprising:
    a dielectric sidewall spacer separating the multi-level nonvolatile electrochemical cell from the self-aligned vertical conductor.

11. The structure of claim 9, wherein the top terminal comprises a single via.

12. The structure of claim 9, wherein a height of the self-aligned vertical conductor is equal to a height of the multi-level nonvolatile electrochemical cell.

13. The structure of claim 9, wherein the self-aligned vertical conductor directly contacts sidewalls of the multi-level nonvolatile electrochemical cell.

14. The structure of claim 9, wherein the pedestal contact comprises multiple individual contact structures.

15. The structure of claim 9, wherein the pedestal contact is a single congruent structure.

16. The structure of claim 9, wherein the pedestal contact surrounds the bottom terminal.

17. A method of forming a memory structure, the method comprising:
    forming a top terminal contacting a top contact;
    forming a multi-level nonvolatile electrochemical cell;
    forming a bottom terminal contacting a variable resistance channel of the multi-level nonvolatile electrochemical cell;
    forming a pedestal contact in the same metal level as the bottom terminal and contacting the variable resistance channel of the multi-level nonvolatile electrochemical cell; and
    forming a vertical conducting fully self-aligned to the multi-level nonvolatile electrochemical cell and extending vertically between the pedestal contact and the top contact.

18. The method of claim 17, further comprising:
    forming a dielectric sidewall spacer separating the multi-level nonvolatile electrochemical cell from the self-aligned vertical conductor.

19. The method of claim 17, wherein the pedestal contact comprises multiple individual contact structures.

20. The method of claim 17, wherein the pedestal contact is a single congruent structure.

* * * * *